US010224476B2

United States Patent
Yan et al.

(10) Patent No.: US 10,224,476 B2
(45) Date of Patent: Mar. 5, 2019

(54) LOW-TEMPERATURE CO-FIRING OF MULTILAYER TEXTURED PIEZOELECTRIC CERAMICS WITH INNER ELECTRODES

(71) Applicant: VIRGINIA TECH INTELLECTUAL PROPERTIES, INC., Blacksburg, VA (US)

(72) Inventors: Yongke Yan, Blacksburg, VA (US); Shashank Priya, Blacksburg, VA (US)

(73) Assignee: VIRGINIA TECH INTELLECTUAL PROPERTIES, INC., Blacksburg, VA (US)

( * ) Notice: Subject to any disclaimer, the term of this patent is extended or adjusted under 35 U.S.C. 154(b) by 988 days.

(21) Appl. No.: 14/376,319

(22) PCT Filed: Feb. 1, 2013

(86) PCT No.: PCT/US2013/024303
§ 371 (c)(1),
(2) Date: Aug. 1, 2014

(87) PCT Pub. No.: WO2013/116616
PCT Pub. Date: Aug. 8, 2013

(65) Prior Publication Data
US 2014/0375174 A1    Dec. 25, 2014

Related U.S. Application Data

(60) Provisional application No. 61/593,650, filed on Feb. 1, 2012.

(51) Int. Cl.
*H01L 41/20* (2006.01)
*C04B 35/64* (2006.01)
(Continued)

(52) U.S. Cl.
CPC .............. *H01L 41/20* (2013.01); *C04B 35/26* (2013.01); *C04B 35/493* (2013.01);
(Continued)

(58) Field of Classification Search
USPC ....... 310/363–366; 252/62.9 PZ, 62, 62.9 R; 501/134
See application file for complete search history.

(56) References Cited

U.S. PATENT DOCUMENTS 7,807,216 B2 * 10/2010 Zhu ...................... C01G 25/006
29/25.35
2008/0193780 A1 * 8/2008 Viehland ................ H01L 41/00
428/446

OTHER PUBLICATIONS

[ME response of cofired trilayer magnet oelectric composites with partial texturing. See J Matter SCI LettersJun. 25 2009 4 pages ].*
(Continued)

*Primary Examiner* — Thomas Dougherty
*Assistant Examiner* — Karen B Addison
(74) *Attorney, Agent, or Firm* — New River Valley IP Law, PC; Michele L. Mayberry

(57) ABSTRACT

Textured PMN-PZT fabricated by templated grain growth (TGG) method has a piezoelectric coefficient (d) of 3 to 5 times that of its random counterpart. By combining this TGG method with low-temperature co-firing ceramics (LTCC) techniques, co-fired multilayer textured piezoelectric ceramic materials with inner electrodes were produced at a temperature as low as 925° C., which silver could be used. Trilayer PMN-PZT ceramics prepared by this method show a strain increase of 2.5 times, a driving voltage decrease of 3 times, and an equivalent piezoelectric coefficient (d*) improvement of 10 to 15 times that of conventional random ceramic counterparts. Further, a co-fired magnetostrictive/piezoelectric/magnetostrictive laminate structure with silver inner electrode was also synthesized. The integration of textured piezoelectric microstructure with the cost-effective low-temperature co-fired layered structure
(Continued)

achieves strong magnetoelectric coupling. These new materials have promising applications including as actuators, ultrasonic transducers, and use in energy harvesters.

9 Claims, 22 Drawing Sheets

(51) Int. Cl.

| | | |
|---|---|---|
| H01L 41/43 | (2013.01) | |
| H01L 41/187 | (2006.01) | |
| H01L 41/273 | (2013.01) | |
| H01L 41/047 | (2006.01) | |
| H01L 41/083 | (2006.01) | |
| C04B 35/26 | (2006.01) | |
| C04B 35/493 | (2006.01) | |
| C04B 35/499 | (2006.01) | |
| H01L 41/16 | (2006.01) | |

(52) U.S. Cl.
CPC ............ *C04B 35/499* (2013.01); *C04B 35/64* (2013.01); *H01L 41/0477* (2013.01); *H01L 41/083* (2013.01); *H01L 41/16* (2013.01); *H01L 41/1875* (2013.01); *H01L 41/273* (2013.01); *H01L 41/43* (2013.01); *C04B 2235/3234* (2013.01); *C04B 2235/3236* (2013.01); *C04B 2235/3249* (2013.01); *C04B 2235/3279* (2013.01); *C04B 2235/3281* (2013.01); *C04B 2235/3284* (2013.01); *C04B 2235/787* (2013.01)

(56) References Cited

OTHER PUBLICATIONS

[Templated grain growth or 001 texture 0.675(mg13nb2/3 o3-0.325 PbTi03 Piezoelectric Ceramic for Magnetic field Sensor J. Am. Ceramic SOC. vol. 94p. 1784-1793 2011 ].*

Richer, T. et al., Textured PMN-PT and PMN-PZT, J. Am. Ceram. Soc., vol. 91, No. 3, pp. 929-933 (2008).
Yan, Y et el., Templated Grain Growth of <001>-Textured 0.675Pb(Mg1/3Nb2/3)O3-0.325PbTiO3 Piezoelectric ceramics for Magnetic Field Sensors, J. Am. Ceram. Soc., vol. 94, No. 6, pp. 1784-1793 (2011).
Co-Pending Application No. PCT/US2013/024303, International Preliminary Report on Patentability dated Aug. 14, 2014, 9 pages.
Co-Pending Application No. PCT/US2013/024303, International Search Report and Written Opinion dated May 30, 2013, 13 pages.
Islam and Priya, "ME response of cofired trilayer magnetoelectric composites with partial texturing." J. Mater. Sci., vol. 44, pp. 5935-5938 (2009).
Israel et al., "A one-cent room-temperature magnetoelectric sensor." Nature Materials, vol. 7, pp. 93-94, 2008.
Kambale et al., "Current status of magnetoelectric composite thin/thick films." Advances in Condensed Matter Physics, vol. 2012, 15 pages, 2012.
Li et al., "Enhanced sensitivity and reduced noise floor in magnetoelectric laminate sensors by an improved lamination process." J. Am. Ceram. Soc., vol. 94, No. 11, pp. 3738-3741, 2011.
Nan et al., "Multiferroic magnetoelectric composites: Historical perspective, status, and future directions." Journal of Applied Physics, vol. 103, 35 pages, 2008.
Sabolsky, E.M. et al., Piezoelectric properties of 001 textured Pb(Mg1/3Nb2/3)O3—PbTiO3 ceramics, Appl. Phys. Lett., vol. 78, No. 17, pp. 2551-2553 (2001).
Wang et al., "An extremely low equivalent magnetic noise magnetoelectric sensor." Advanced Materials, vol. 23, pp. 4111-4114, 2011.
Yan et al., "Giant energy density in [001]-textured Pb(Mg1/3Nb2/3)O3—PbZrO3—PbTiO3 piezoelectric ceramics." Applied Physics Letters, vol. 102, 5 pages, 2013.
Yan et al., "Piezoelectric properties and temperature stability of Mn-doped Pb(Mg1/3Nb2/3)—PbZrO3—PbTiO3 textured ceramics." Applied Physics Letters, vol. 100, 5 pages, 2012.

* cited by examiner

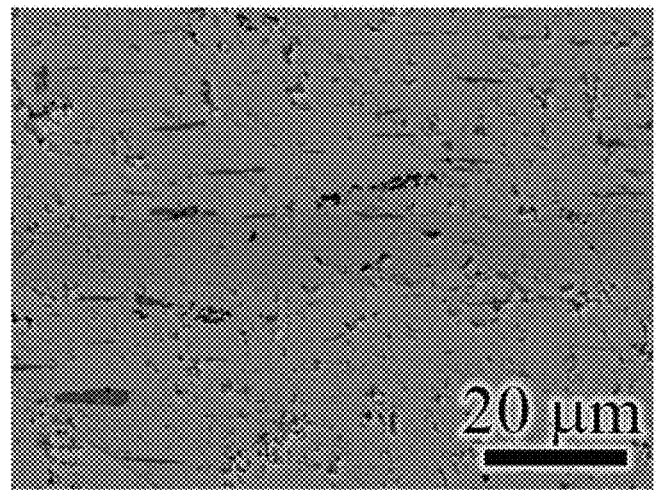
FIG. 1
FIG. 1 SEM image of textured PMN-PZT with Ag inner electrode co-fired at 925 °C (cross-sectional view, polished specimen).
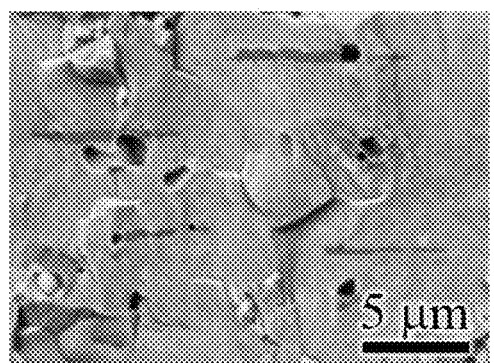 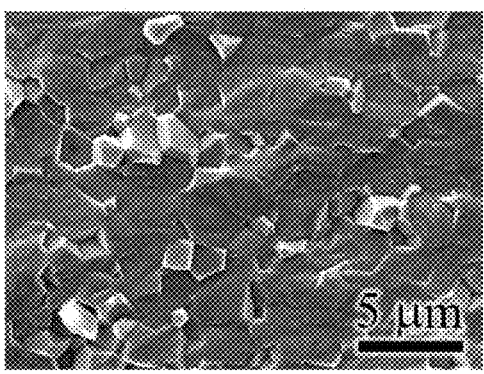
FIG. 2A          FIG. 2B
FIGS. 2A-B SEM images of (a) co-fired textured PMN-PZT and (b) a random counterpart (cross-sectional view, fractured specimen).

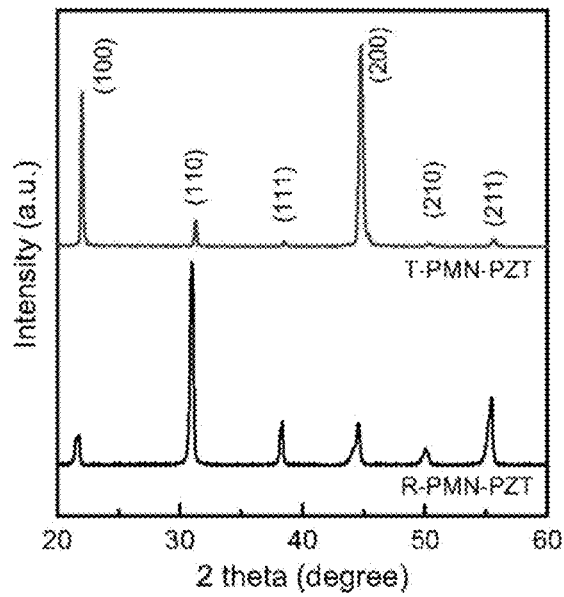
FIG. 3 XRD patterns of co-fired textured PMN-PZT (T-PMN-PZT) and a random counterpart (R-PMN-PZT).
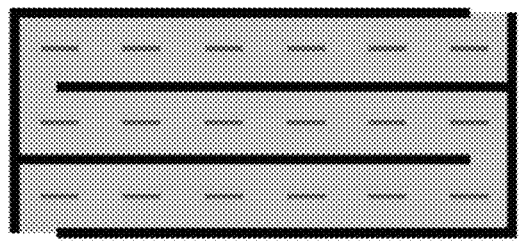
FIG. 4 Schematic diagram of co-fired multilayer textured PMN-PZT with Ag inner electrode.

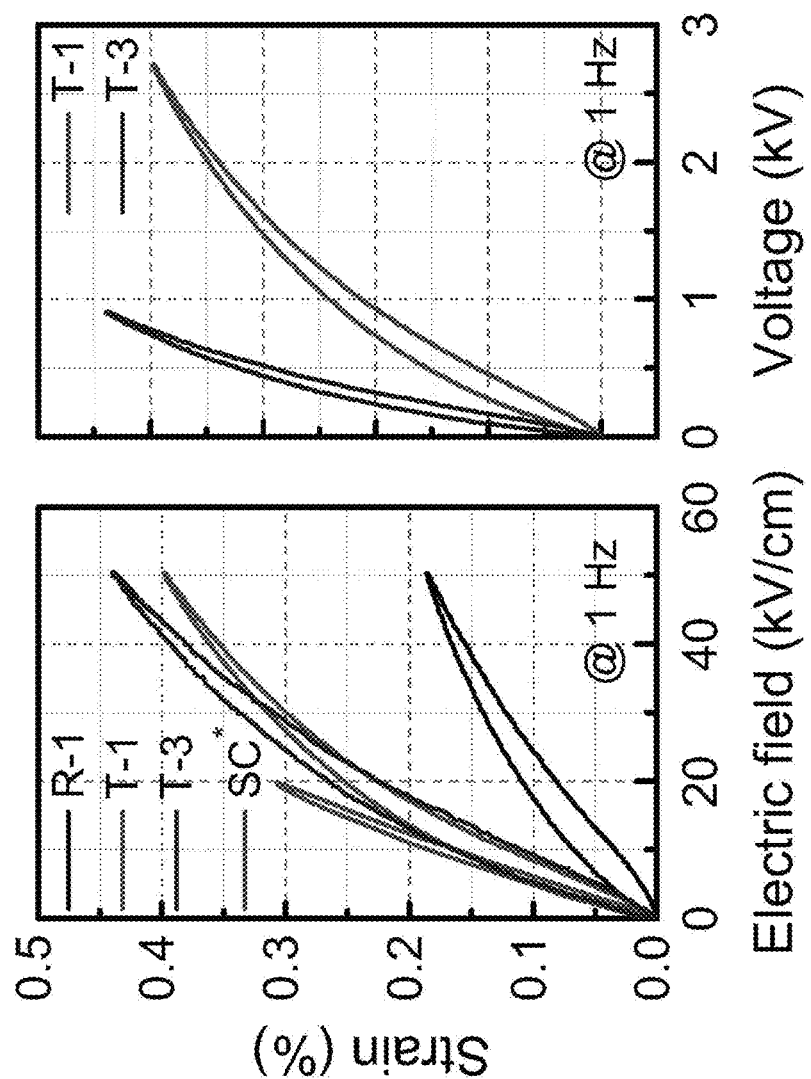
FIGS. 5A-B. (A) Strain vs. Electric Field curves for different PMN-PZT materials and (B) Strain vs. Driving Voltage for textured ceramics.

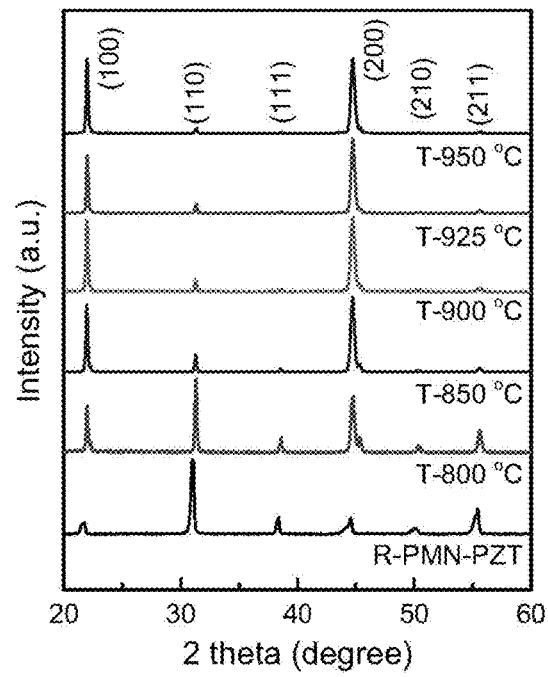
FIG. 6A XRD patterns of textured (T) ceramics and random ceramic (R-PMN-PZT).
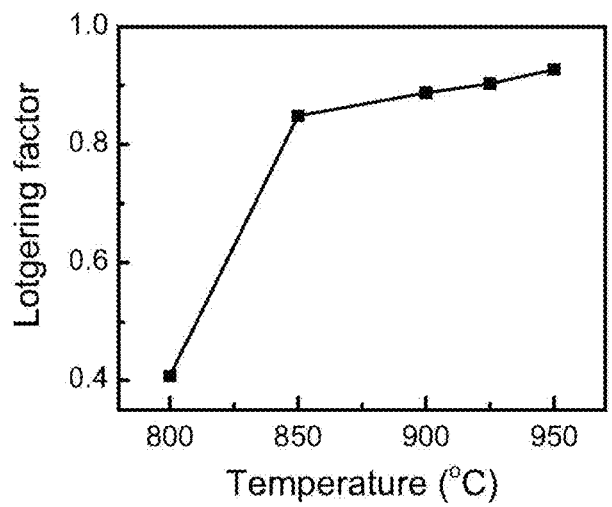
FIG. 6B Lotgering factor of various textured ceramics.

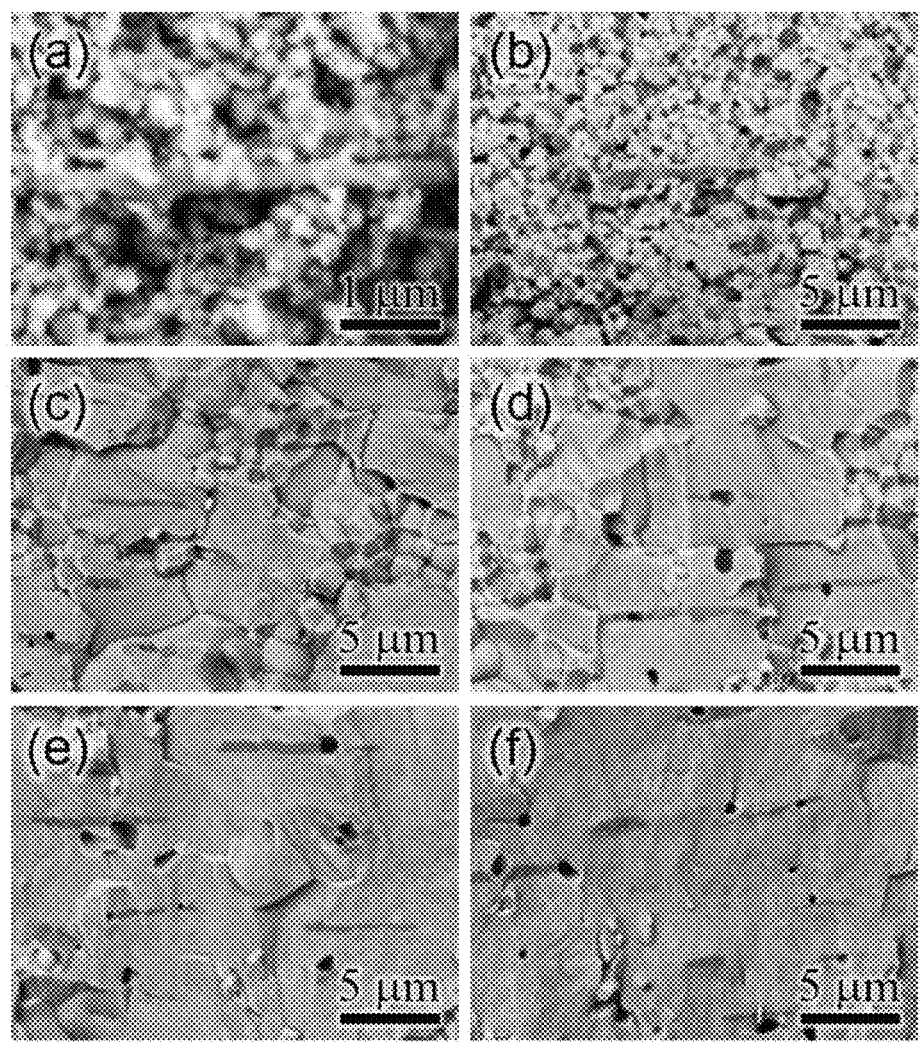
FIGS. 7A-F
FIGS. 7A-F Cross-sectional SEM images of textured ceramics (fractured specimens) co-fired at different temperatures.

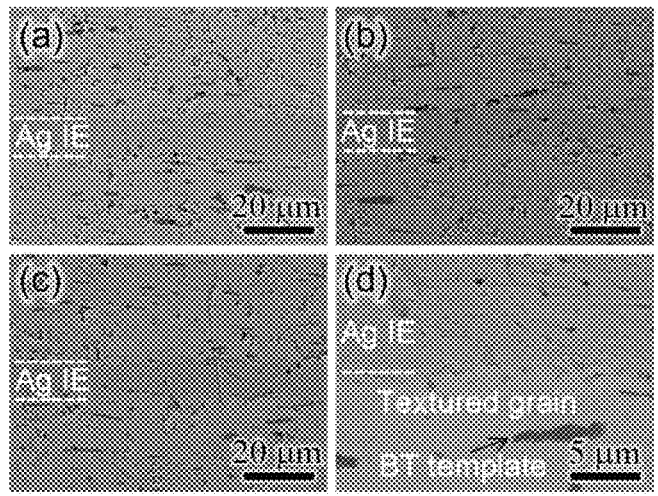
FIGS. 8A-D
FIGS. 8A-D Cross-sectional SEM images of various textured ceramics (polished) co-fired at different temperatures.
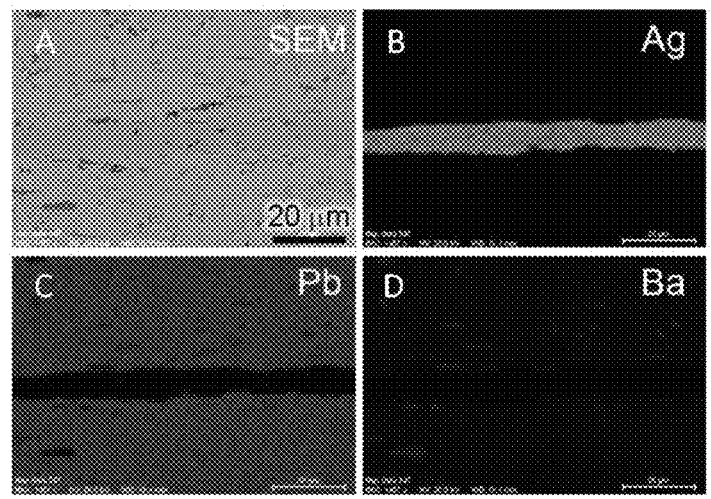
FIGS. 9A-D
FIGS. 9A-D (A) SEM and (B-D) EDS mapping images of textured ceramic/Ag inner electrode co-fired at 925 °C.

FIG. 10 EDS line scanning interface analysis of various textured ceramics with Ag inner electrode co-fired at 925 °C.

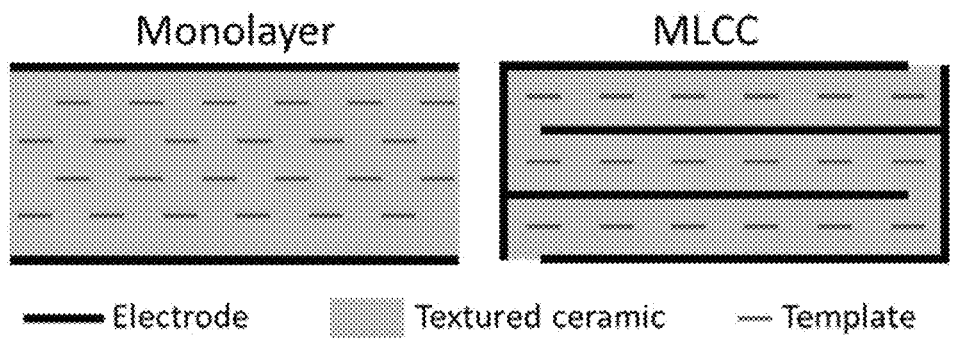
FIGS. 11A-B (A) Monolayer and (B) multilayer actuators (MLA) formed from multilayer co-fired ceramic (MLCC).
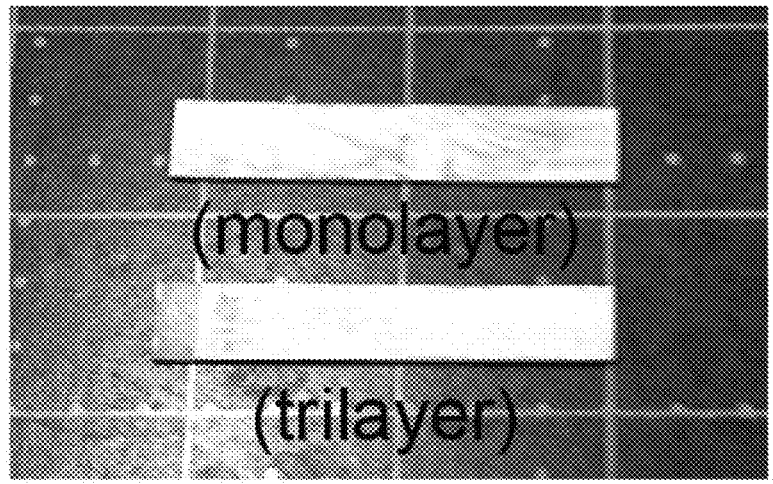
FIG. 11C
FIG. 11C Optical image of the monolayer and multilayer actuator (MLA) illustrated schematically in FIGS. 11A-B.

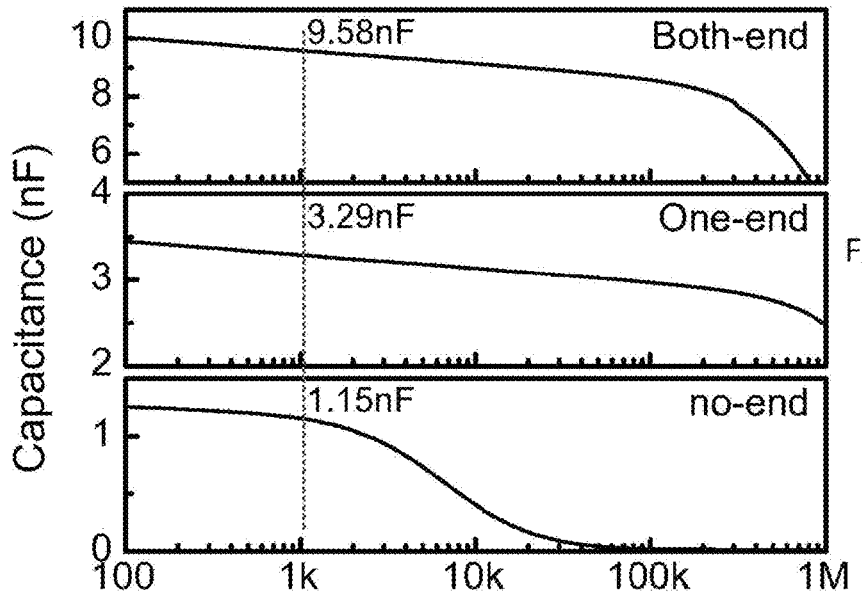
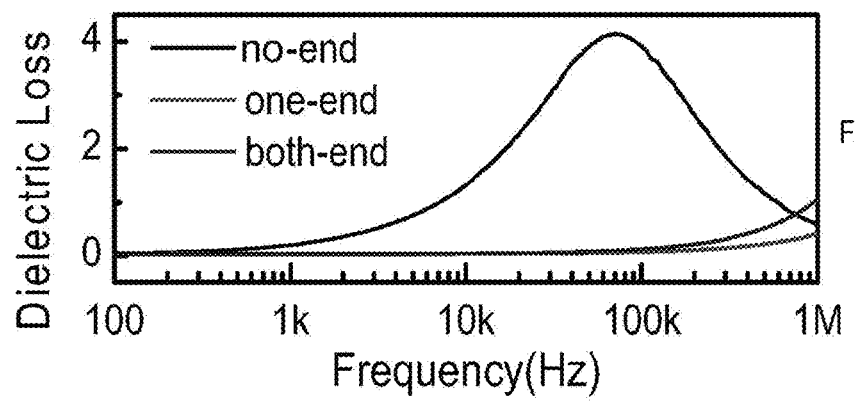
FIGS. 12A-B (A) Capacitance and (B) dielectric loss of co-fired multilayer ceramics with different end connection.

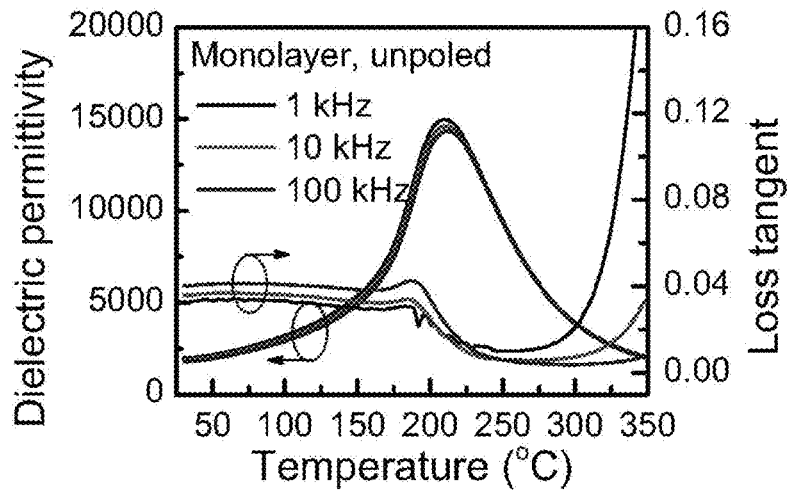
FIG. 13A Dielectric permittivity and loss of monolayer co-fired sample.
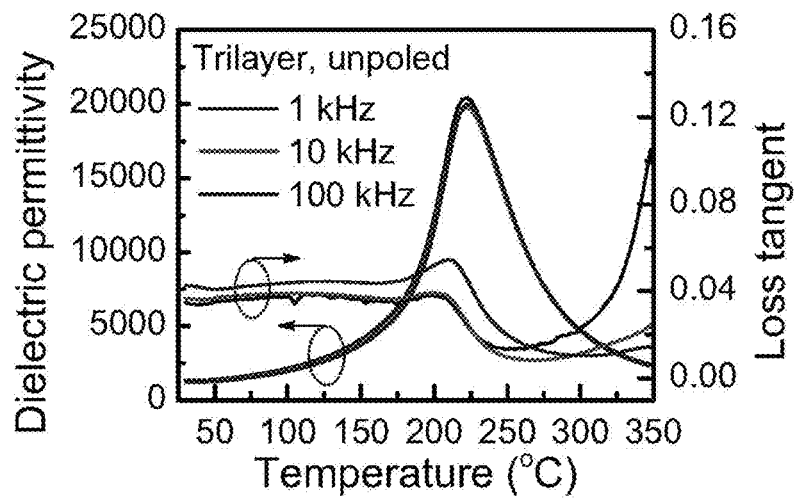
FIG. 13B Dielectric permittivity and loss of trilayer co-fired sample.

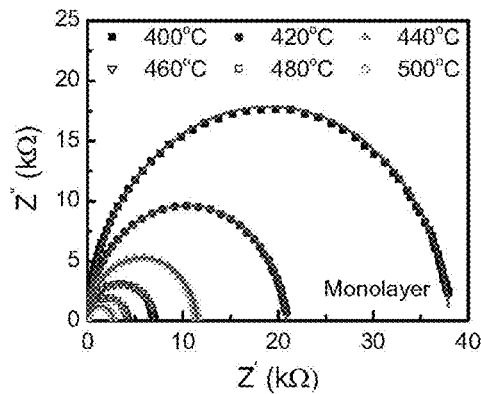
FIG. 14A Impedance of monolayer co-fired sample.
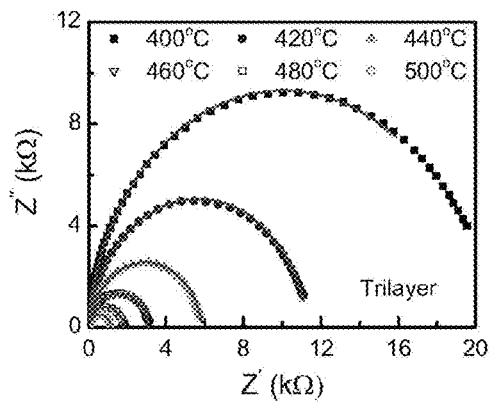
FIG. 14B Impedance of trilayer co-fired sample.
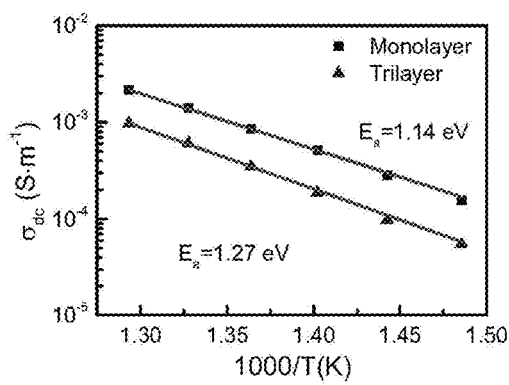
FIG. 14C DC conductivity $\sigma_{dc}$ of monolayer and trilayer co-fired samples.
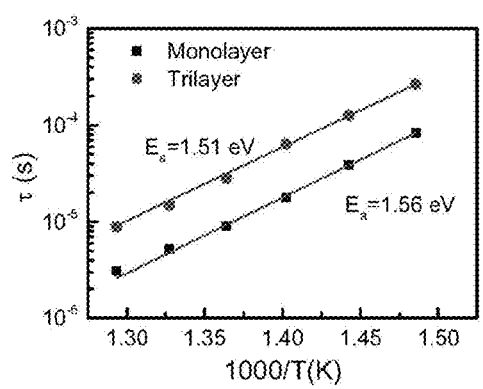
FIG. 14D Relaxation time ($\tau$) of monolayer and trilayer co-fired samples.

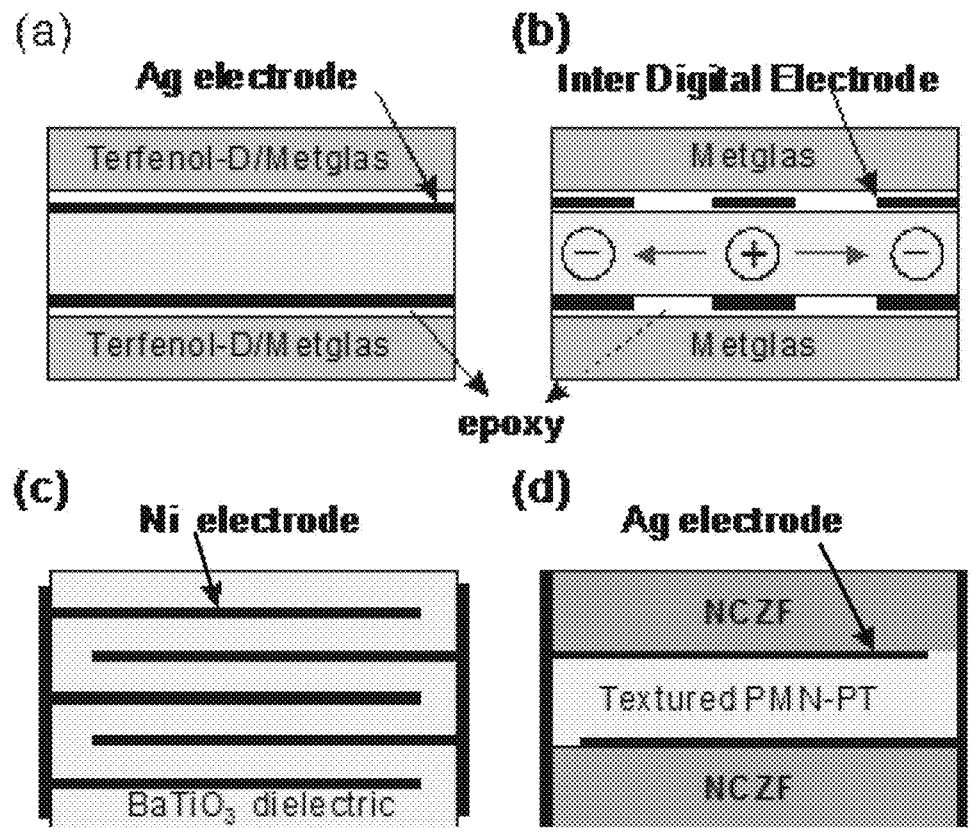
FIGS. 15A-D
FIGS. 15A-D Schematic diagrams of various layered magnetoelectric (ME) composite structures.

FIG. 16A Optical image of co-fired NCZF/Textured-PMN-PT/NCZF laminate composite synthesized at 930 °C.

FIG. 16B Cross-sectional SEM image of a C-N/T/N composite.

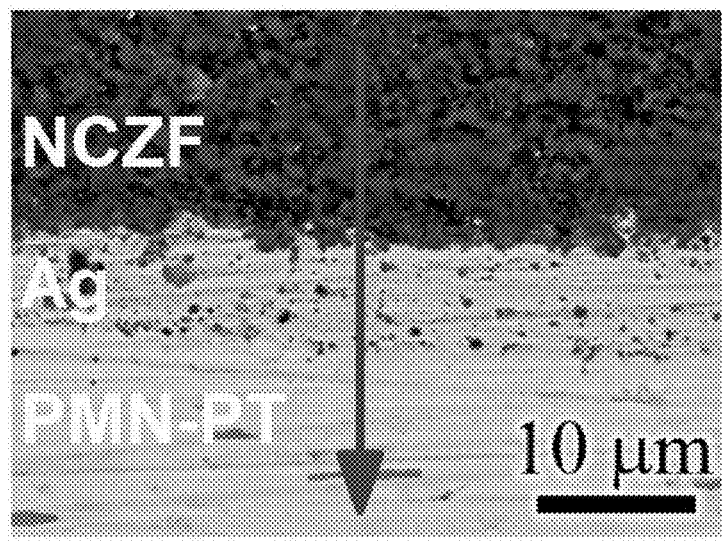
FIG. 16C cross-sectional SEM image of the C-N/T/N composite of FIG. 16B.
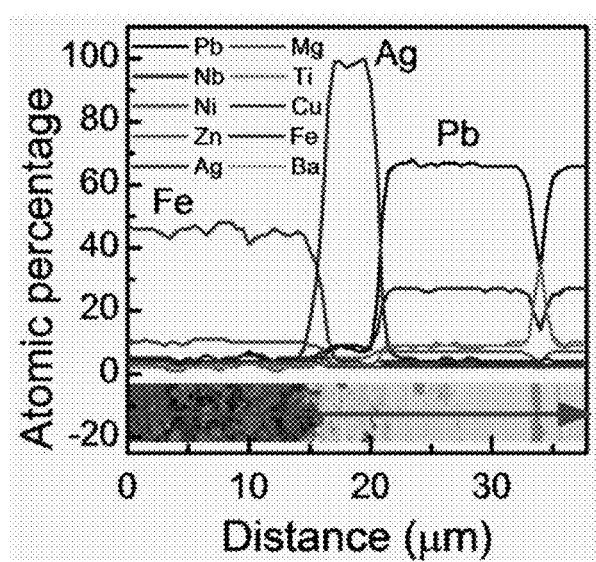
FIG. 16D EDS/SEM element line scanning analysis of the C-N/T/N composite of FIGS. 16B-C.

FIG. 17A SEM image showing element mapping of co-fired NCZF/T-PMN-PT/NCZF laminate.

FIG. 17B SEM image showing piezoelectric layer with a 140μm thickness and an Ag electrode with a thickness of 10 μm.

FIG. 17C SEM image showing element mapping of co-fired NCZF/T-PMN-PT/NCZF laminate.

FIG. 17D SEM image showing element mapping of co-fired NCZF/T-PMN-PT/NCZF laminate.

FIG. 17E SEM image showing element mapping of co-fired NCZF/T-PMN-PT/NCZF laminate.

FIG. 17F SEM image showing element mapping of co-fired NCZF/T-PMN-PT/NCZF laminate.

FIG. 18A Cross-sectional SEM image of the NCZF layer of the C-N/T/N composite of FIGS. 17A-F.

FIG. 18B Cross-sectional SEM image of the C-N/T/N composite of FIGS. 17A-F showing a textured layer (T-PMN-PT layer) and a random layer (R-PMN-PT layer).

FIG. 18C Cross-sectional SEM image of the R-PMN-PT layer of the C-N/T/N composite of FIGS. 17A-F.

FIG. 18D Planar XRD patterns of the different layers of the C-N/T/N composite of FIGS. 17A-F.

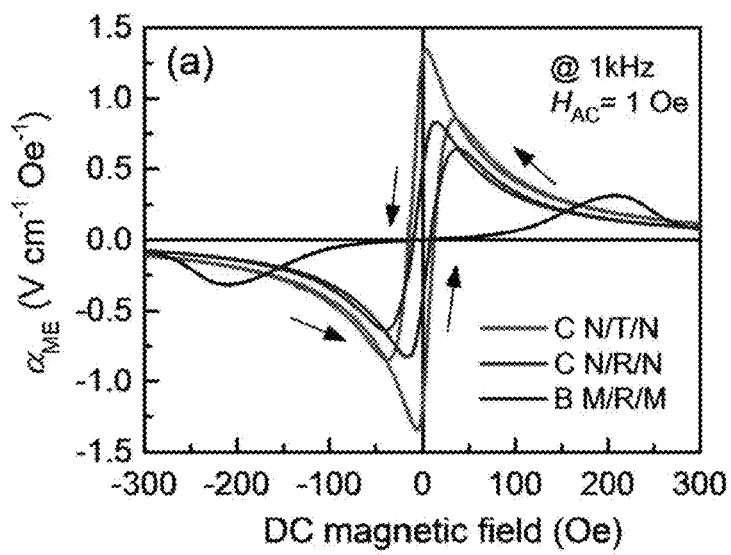
FIG. 19A ME voltage coefficients ($\alpha_{ME}$) of various co-fired composites and an epoxy bonded laminate.
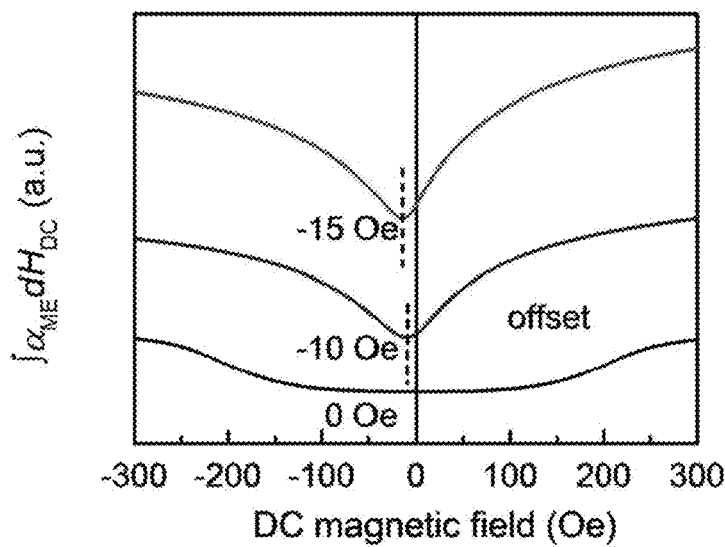
FIG. 19B Integral values of $\alpha_{ME}$ against the DC magnetic field for the samples of FIG. 19A.

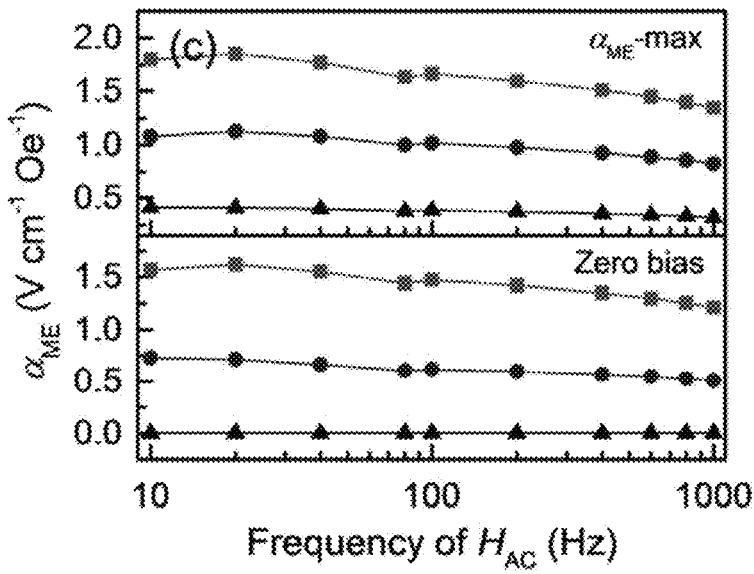
FIG. 19C ME voltage coefficients ($\alpha_{ME}$) as a function of the frequency of applied ac magnetic field ($H_{ac}$) for the samples of FIGS. 19A-B.
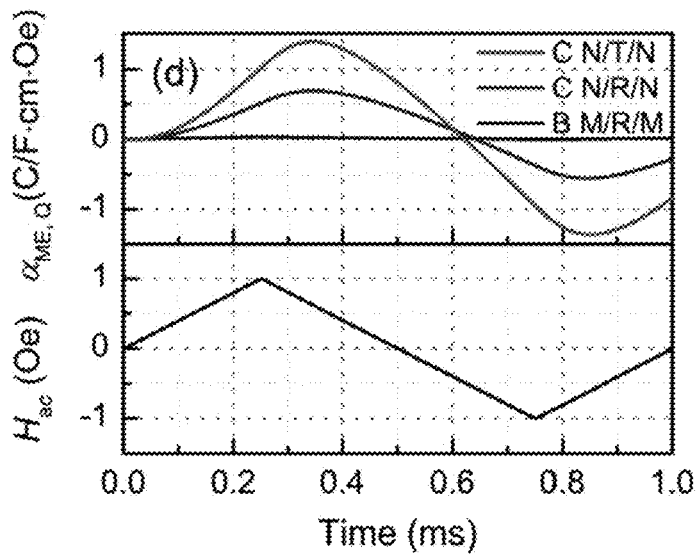
FIG. 19D Dynamic ME charge coefficients ($\alpha_{ME}$) and applied ac magnetic field spectra as a function of time for various samples.

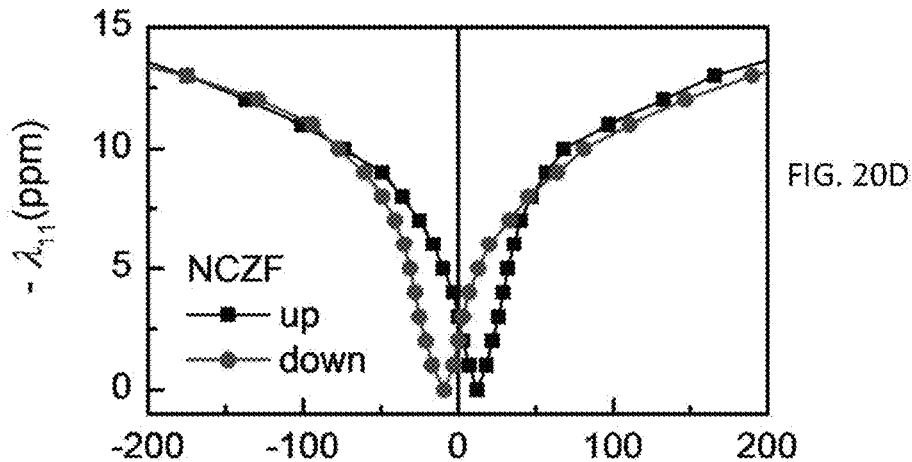
FIG. 20D DC magnetic field ($H_{DC}$) dependence of the magnetostriction ($\lambda$) of NCZF (not co-fired).
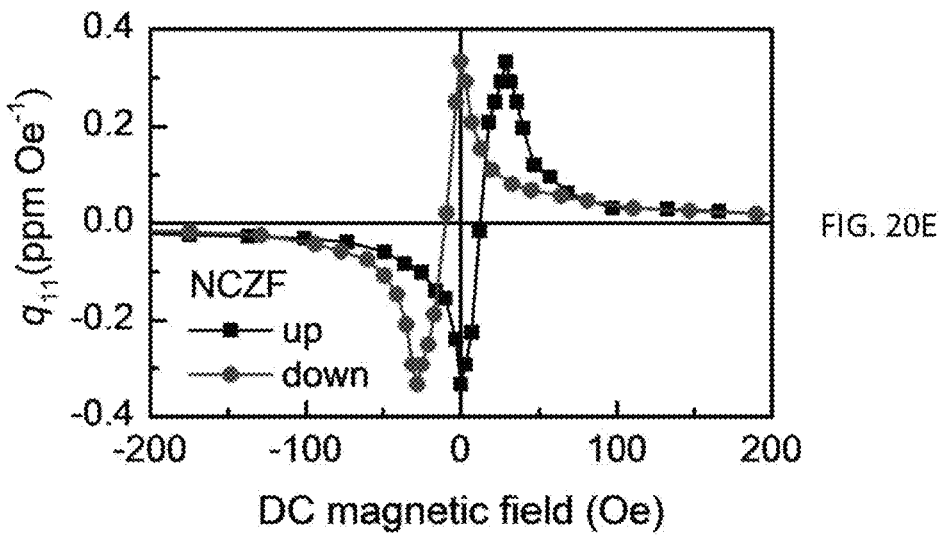
FIG. 20E DC magnetic field ($H_{DC}$) dependence of the (E) piezomagnetic coefficients (q) of NCZF (not co-fired).

LOW-TEMPERATURE CO-FIRING OF MULTILAYER TEXTURED PIEZOELECTRIC CERAMICS WITH INNER ELECTRODES

CROSS-REFERENCE TO RELATED APPLICATIONS

This application is a National Stage application under 35 USC § 371 of International Application No. PCT/US13/24303, filed Feb. 1, 2013, which application relies on the disclosure of and claims priority to and the benefit of the filing date of U.S. Provisional Application No. 61/593,650, filed Feb. 1, 2012, the disclosures of each of which are hereby incorporated by reference herein in their entireties.

BACKGROUND OF THE INVENTION

Field of the Invention

The present invention relates to the field of piezoelectric ceramic compositions, methods of making them and devices comprising them. More particularly, embodiments of the present invention relate to piezoelectric ceramic compositions, which can be incorporated into actuators, transducers, transformers, sensors, and energy harvesters. Particular embodiments of the invention include layered ceramic materials with texture and improved piezoelectric and/or magnetostrictive properties.

Description of Related Art

Piezoceramic materials based on lead zirconate and lead titanate, otherwise referred to as lead-zirconate-titanate ceramics (PZT), are useful in a number of industries as actuators and transducers due to their good mechanical and piezoelectric properties. In an attempt to improve on these properties and increase performance and efficiency of the ceramic materials, PZT is sometimes doped with alkaline earth metals or rare earth metals. Doping, however, has its limitations in that it is difficult and rare to achieve a level of performance equivalent to that of the giant piezoelectric properties of single crystals.

For example, oriented relaxor-based piezoelectric single crystals such as $Pb(Mg_{1/3}Nb_{2/3})O_3$—$PbTiO_3$ (PMN-PT) and $Pb(Zn_{1/3}Nb_{2/3})O_3$—$PbTiO_3$ (PZN-PT) with rhombohedral structure near morphotropic phase boundary (MPB) exhibit $d_{33}$ of >2000 pC/N and $k_{33}$ of >92%. Such giant piezoelectric properties of rhombohedral crystals are related to their piezoelectric anisotropy and engineered domain state that facilitate the rotation of polarization toward the direction. Owing to their ultrahigh d and k values, domain-engineered piezoelectric crystals are considered very promising materials for actuators, transformers, sensors, and recent emerging energy harvesters. Single crystals usually involve a costly fabrication process (high-temperature melting and annealing process for a long time and use of platinum crucibles) as compared to a polycrystalline ceramic synthesis process. Additionally, the size of traditional crystal products restricts their industrial applications especially where large dimension components are required, such as in a low frequency resonance mode vibration harvester.

Thus, there is a need for developing polycrystalline ceramic products with properties similar to that of their single crystal counterparts. Processes exist for preparing polycrystalline species, however, such processes typically result in synthesizing randomly oriented polycrystalline ceramics. Although preparing randomly oriented polycrystalline products is economical and not limited in product size, the superior piezoelectric properties of single crystals are hardly observed in randomly oriented polycrystalline ceramics where piezoelectric properties are averaged out by randomly distributed crystalline grains.

One method of improving on the piezoelectric properties of these ceramic materials involves texturing the PZT ceramic. Textured ceramics have grains or crystallites in the ceramic structure with the same orientation as contrasted with randomly oriented structures. Such an ordered orientation leads to improved properties of the material.

Thus, what is needed is a strategy for overcoming the drawbacks of single crystals and achieving high piezoelectric properties in a polycrystalline structure. More particularly, what is needed is a low cost method for producing piezoelectric ceramic materials with high d and/or k values and with texturing (grain orientation along the crystallographic direction) that have an engineered domain state similar to that of single crystals.

SUMMARY OF THE INVENTION

To this end, the inventors employ a texturing technique using templated grain growth (TGG) methods to provide improved piezoelectric ceramic compositions with remarkable property enhancement above random oriented materials.

Objects of the present invention provide compositions which can be used for energy harvesting and energy sensing. Further, the inventive compositions can be used in devices for generating electric power. Such devices may include piezoelectric type devices which harvest mechanical stress from a source and convert the energy into electrical energy using a piezoelectric transducer. Indeed, the compositions can be used in applications where such energy is converted using a direct piezoelectric effect. The compositions may also be useful in applications where electrical energy is processed or stored for later use.

In particular, a cost-effective way to create devices with a multilayer structure, such as a multilayer actuator (MLA), is provided using a templated grain growth process combined with a low-temperature co-firing ceramics process.

MLA has been extensively explored because of its rapid response, low power consumption, small dimensions, high precision control, and low noise as compared to conventional electromagnetic actuators (EMA). The principle of a multilayer actuator is that thin layers of piezoelectric ceramic material are electrically connected in parallel. Displacement ($\Delta h$) of the MLA is given by: $\Delta h = n_{d33} V$. The displacement ($\Delta h$) is proportional to the applied voltage (V), the number of piezoelectric layers (n), and the piezoelectric coefficient of the material ($_{d33}$) otherwise referred to as the piezoelectric stress constant.

From a materials science and engineering prospective, there are two fundamental issues that need to be well investigated to aid the development of high performance MLAs. First, materials with a high piezoelectric coefficient are needed. As mentioned above, texturing of ceramic is one promising and feasible way to satisfy this requirement. Second, it is highly desirable to prepare such materials by co-firing with metal electrodes. A major consideration in the fabrication of such materials is the cost of the electrode pastes. Currently, most MLAs use expensive Ag—Pd or Ag—Pt alloys as inner electrodes for compatibility with the traditional ceramic sintering processes, which are typically performed at high temperature. Ideally, the co-firing temperature should be lower than the melting point of Ag (961° C.) to enable the use of an Ag electrode without noble Pd, Pt components. With the decrease of co-firing temperature, possible processing induced defects may result, such as low density, sintering aid, poor mechanical adhesion and electrical contact of the piezoelectric-electrode interface. These risks should be minimized to avoid the degradation of piezoelectric properties. In the case of textured ceramics, texture development is a process of nucleation and growth of matrix grains on the template. Based on the consideration of the thermodynamics and dynamics, high temperature is required to achieve a high texture degree and good properties. Therefore, a trade-off is required to select a co-firing temperature that best matches the requirements of low manufacturing cost and good material properties.

A specific object of the invention is Object 1, which includes a composition comprising a ceramic of formula: $0.4Pb(Mg_{1/3}Nb_{2/3})O_3$-$0.25PbZrO_3$-$0.35PbTiO_3$, wherein the ceramic has texture. Such compositions can comprise $BaTiO_3$ platelets as seed crystals oriented within the ceramic to a desired degree. Further, the platelets can be present in the compositions in an amount based on volume of the ceramic ranging from between 0 and 20%, such as from about 0.5-15%, or from about 1-10%, or from about 2-5%, for example.

Object 2 is the composition of Object 1, wherein the $BaTiO_3$ platelets have an aspect ratio of greater than 1, such as an aspect ratio of from 2-40, or an aspect ratio of from 3-30, or an aspect ratio of from 4-20, or an aspect ratio of from 5-10.

Object 3 is the composition of Object 1 or 2 and having a piezoelectric coefficient $d_{33}$ ranging from 100-4000 pC/N, such as a piezoelectric coefficient $d_{33}$ ranging from about 300-3000 pC/N, or from 500-2500 pC/N, such as 1000-2000 pC/N, or even 1500-1800 pC/N.

Object 4 is the composition of any of Objects 1-3 and having a degree of orientation measured by a Lotgering factor of 90% or more, such as a Lotgering factor of from 91-99%, or from 92-98%, or from 93-97%, or from 94-96%.

Object 5 is the composition of any of Objects 1-4 and having a strain increase of greater than 1×, 2×, 3×, 4×, 5×, 6×, 7×, 8×, 9×, 10× etc. that of a random oriented counterpart. A random oriented counterpart in the context of this specification is a sample of the same chemical constitution but without purposeful orienting of the polycrystalline configuration.

Object 6 is the composition of any of Objects 1-5 and having a decrease in driving voltage of greater than 1×, 2×, 3×, 4×, 5×, 6×, 7×, 8×, 9×, 10× etc. that of a random oriented counterpart having an empirical formula that is the same as the textured species.

Object 7 is the composition of any of Objects 1-6 further comprising at least one internal electrode. As discussed in more detail below, the electrode can comprise any metal material, but is preferably silver (Ag).

Object 8 is the composition of any of Objects 1-7, which is prepared by heating the sample to no more than 450° C. (such as 200° C., 300° C., 400° C., or 450° C.) for about 2 hours (such as for 30 min., or 1 hour, or 1.5 hours) and sintering at up to 950° C. (such as from 800-900° C., or from 850-900° C., or from 900-930° C.).

Object 8 is the composition of any of Objects 1-8, wherein the composition comprises more than one layer one of which is a magnetostrictive layer. As will be revealed in greater detail below, the piezoelectric layer can be formed by stacking multiple sheets of green body one on top of another and then compressed into an apparently single layer as well.

Object 9 is a method of making a piezoelectric ceramic material of any of the composition type Objects detailed herein, where the method comprises: (a) combining as a mixture a precursor piezoelectric powder with seed templates; (b) forming a green body from the mixture and orienting the seed templates in a desired manner within the green body; (c) layering the green body or portions of the green body from 5 to 50 times; and (d) heating to no more than 450° C. for about 2 hours and sintering at up to 930° C.

Object 10 is a method of making a multilayer actuator comprising: (a) combining a PMN-PZT matrix with $BaTiO_3$ platelets as seeds; (b) forming a ceramic green body sample from the PMN-PZT matrix and the seeds by orienting the seeds in a desired manner within the PMN-PZT matrix; (c) heating the sample under a first pressure, temperature, and time; (d) stacking portions of the sample; (e) laminating the stacked sample under a second pressure, temperature, and time; (f) printing an electrode layer on one or more surfaces of the laminated sample; (g) stacking portions of the laminated sample; (h) laminating the stacked, printed sample at 200-500° C.; (i) compressing the laminated printed sample under a third pressure, temperature, and time; (j) sintering the laminated compressed sample for a fourth pressure, temperature, time.

Object 11 is the method of either Object 9 or 10, wherein sintering comprises embedding the sample in calcined PMN-PZT powder comprising excess PbO. The PbO is used as liquid sintering aid.

Object 12 is the method of any of Objects 9-11, wherein the precursor piezoelectric (otherwise referred to as the PMN-PZT matrix) comprises $0.4Pb(Mg_{1/3}Nb_{2/3})O_3$-$0.25PbZrO_3$-$0.35PbTiO_3$. According to these Objects, other acceptable PMN:PZ:PT ratios can include 41:24:35, or 41:23:36, or 42:21:37, or 42:22:36, or 43:20:37, or any ratio in between.

Object 13 is the method of any of Objects 1-12, wherein the seed templates comprise $BaTiO_3$ platelets having an aspect ratio of greater than 5, such as greater than 10.

Object 14 is the method of any of Objects 1-14, wherein stacking the sample or portions of the sample comprises folding the sample on itself at least six times or comprises cutting at least six portions from the sample and stacking the portions on top of one another, such as stacking from 2-50 times, for example, from 3-40 times, or 4-30 times or, 5-20 times, etc.

Object 15 is the method of any of Objects 1-14, wherein laminating of the stacked sample comprises subjecting the stacked sample to compression using a uniaxial hot press at 80° C. to achieve a single thick piezoelectric layer. Other temperatures can be used as is explained in further detail below.

Object 16 is the method of any of Objects 1-15, wherein compressing of the laminated printed sample comprises a pressure of 100-300 MPa for about 1 minute at room temperature, such as at about 200 MPa.

Object 17 is the method of any of Objects 1-16, wherein sintering is performed at a temperature ranging from 800~950° C. and is preferably performed for about 2 hours in air.

Object 18 is a magnetostrictive/piezoelectric/magnetostrictive laminate composite composition with silver inner electrode, wherein the piezoelectric layer comprises PMN-PT or PMN-PZT with texture.

Object 19 is the composition of Object 18, wherein the magnetostrictive layer comprises ferrite, Terfenol-D, or Metglas, such as NCZF.

Object 20 is the composition of any of Objects 18 or 19, wherein the PMN-PT is $Pb(Mg_{1/3}Nb_{2/3})O_3$-$32.5PbTiO_3$.

Object 21 is the composition of any of Objects 18-20, wherein the magnetostrictive layer is chosen from one or more of $(Ni_{0.8}Cu_{0.2}Zn_{02})Fe_2O_4$, $(Ni_{0.6}Cu_{0.2}Zn_{0.2})Fe_2O_4$, or $(Ni_{0.6}Cu_{0.2}Zn_{0.2})Fe_2O_3$.

Object 22 is the composition of any of Objects 18-21, which is prepared by the any part or all of any method disclosed in this specification, including particularly the methods of Objects 9-17 and comprising a magnetostrictive/piezoelectric/magnetostrictive laminate composite with silver inner electrode, wherein the piezoelectric layer comprises PMN-PT or PMN-PZT with texture.

Object 23 is the composition of any of Objects 18-22 characterized by having giant self-biased magnetoelectric coupling.

BRIEF DESCRIPTION OF THE DRAWINGS

The accompanying drawings illustrate certain aspects of some of the embodiments of the present invention, and should not be used to limit or define the invention. Together with the written description, the drawings serve to explain certain principles of embodiments of the invention.

FIG. 1 is scanning electron microscopy (SEM) image of textured PMN-PZT with a silver (Ag) inner electrode co-fired at 925° C. (cross-sectional, polished).

FIGS. 2A-B are SEM images of (A) co-fired textured PMN-PZT and (B) random counterpart (cross-section, fracture).

FIG. 3 is a graph showing XRD patterns of co-fired textured PMN-PZT and random counterpart.

FIG. 4 is a schematic diagram of co-fired multilayer textured PMN-PZT with Ag inner electrode.

FIGS. 5A-B are graphs showing (A) strain vs. electric field curves for different PMN-PZT materials and (B) strain vs. driving voltage for textured ceramics.

FIGS. 6A-B are graphs showing (A) XRD patterns of textured (τ) ceramics co-fired at different temperature and random ceramic (R-PMN-PZT) sintered at 1150° C. and (B) Lotgering factor of textured ceramics co-fired at different temperature.

FIGS. 7A-F are cross-section SEM images of textured ceramics (fracture) co-fired at temperatures of: (a) 400° C.; (b) 800° C.; (c) 850° C.; (d) 900° C.; (e) 925° C.; (f) 950° C.

FIGS. 8A-D are cross-section SEM images of textured ceramics (polished) co-fired at temperatures of: (a) 900° C.; (b) 925° C.; (c) 950° C.; (d) 925° C., high magnification.

FIGS. 9A-D are (A) SEM and (B-D) EDS mapping images of textured ceramic/Ag inner electrode co-fired at 925° C.

FIGS. 11A-C are (A)-(B) schematic diagrams of monolayer and MLA, respectively, and (C) corresponding optical images.

FIGS. 12A-B are graphs showing (A) capacitance and (B) dielectric loss of co-fired multilayer ceramics with different end connection.

FIGS. 13A-B are graphs showing the dielectric permittivity and loss of (A) monolayer and (B) trilayer co-fired samples.

FIGS. 14A-D are graphs showing impedance of (A) monolayer and (B) trilayer co-fired samples measured at different temperatures; and (C) DC conductivity $\sigma_{dc}$ and (D) relaxation time (τ) of monolayer and trilayer co-fired samples at different temperatures.

FIGS. 15 A-D are schematic diagrams of layered ME composite structures.

FIGS. 16B-C are polished cross-sectional SEM images of a C—N/T/N composite.

FIG. 16D is a graph showing EDS/SEM element line scanning analysis.

FIG. 19A is a graph showing ME voltage coefficients ($\alpha_{ME}$) of co-fired NCZF/T-PMN-PT/NCZF (C—N/T/N), NCZF/R-PMN-PT/NCZF (C—N/R/N), and epoxy bonded Metglas/R-PMN-PT/Metglas (B-M/R/M) laminate.

FIG. 19B is a graph of integral values of $\alpha_{ME}$ against the DC magnetic field.

FIG. 19C is a graph showing ME voltage coefficients ($\alpha_{ME}$) as a function of the frequency of applied ac magnetic field ($H_{AC}$).

FIG. 19D is a graph of the dynamic ME charge coefficients ($\alpha_{ME}$) and applied ac magnetic field spectra as a function of time for C—N/T/N, C—N/R/N composite, and epoxy bonded Metglas/R-PMN-PT/Metglas (B-M/R/M) laminate, under zero-DC magnetic field.

FIGS. 20D-E are graphs showing DC magnetic field ($H_{DC}$) dependence of (D) the magnetostriction (λ) and (E) piezomagnetic coefficients (q) of NCZF (not co-fired).

DETAILED DESCRIPTION OF VARIOUS EMBODIMENTS OF THE INVENTION

Figure 10:
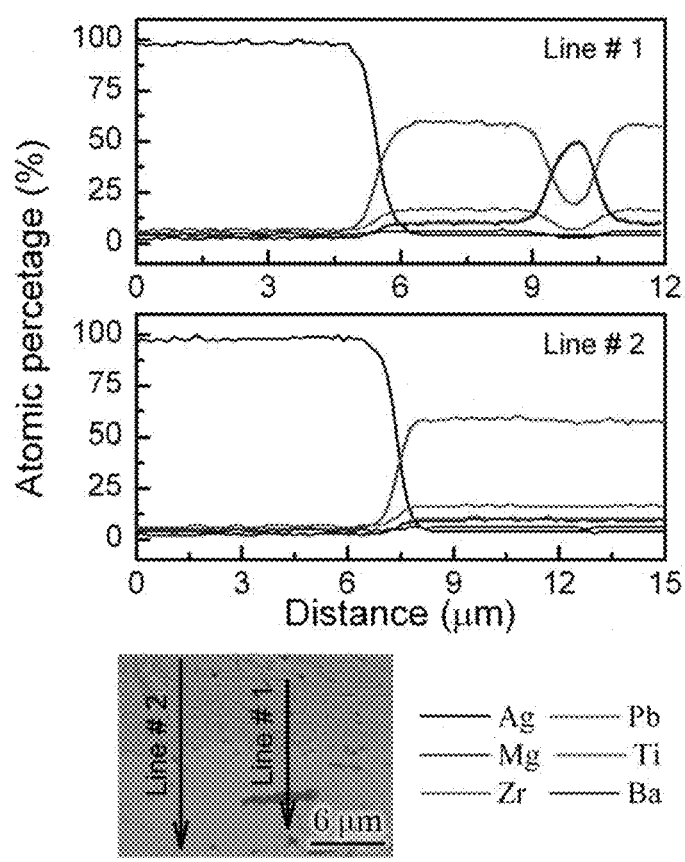
FIG. 10 is a graph showing EDS line scanning interface analysis of textured ceramic/Ag inner electrode co-fired at 925° C.

Reference will now be made in detail to various exemplary embodiments of the invention. It is to be understood that the following discussion of exemplary embodiments is not intended as a limitation on the invention. Rather, the following discussion is provided to give the reader a more detailed understanding of certain aspects and features of the invention.

Embodiments of the invention include co-fired multilayer textured piezoelectric ceramic materials with metal inner electrodes. The term "co-fired" in the context of this specification refers to common sintering of the precursory piezo-ceramic material and the electrode material. Preferred embodiments are co-fired at a temperature as low as 925° C., which enable the use of silver as the electrode. Such multilayer textured piezoelectric ceramics show significantly enhanced electromechanical performance.

It is not critical they type of material used for the electrode and any metal can be used, such as silver, copper, palladium, platinum, and combinations of one or more of these.

Compositions of the present invention may be prepared by numerous methods, including conventional techniques. An exemplary method of making the compositions is provided in more detail below, however, one of skill in the art would know that the method steps can be perfomed in any order, that one or more of the steps may be omitted depending on a particular result desired, and/or that additional steps may be incorporated.

In particular embodiments, textured polycrystalline piezoelectric ceramics can be prepared using Templated Grain Growth (TGG) techniques. Very generally, seed crystallites are prepared using any suitable material, such as barium titanate; then the seed crystals are combined with a precursor material, such as lead-zirconate-titanate, to form the desired ceramic in its green state having the seed crystals oriented in a desired manner throughout; and then heat is applied. More specifically, in the TGG process, large anisotropic template particles are oriented in a fine particle matrix in the green state. The template particles grow during heat treatment and consume the surrounding matrix grains thereby creating a crystallographically oriented ceramic. To obtain a desired ceramic structure using TGG processing, the template and matrix components are selected appropriately. In embodiments, the particles of the matrix should have a high surface area to provide sufficient driving force for densification and grain growth, while the particles of the templates are preferably large, anisotropic and crystallographically isostructural with the matrix material.

One step in the fabrication process of compositions of the invention is to prepare green tape for use as a piezoelectric layer. This step involves synthesizing PMN-PZT matrix powder, for example, $0.4Pb(Mg_{1/3}Nb_{2/3})O_3\text{-}0.25PbZrO_3\text{-}0.35PbTiO_3$ (PMN-PZT) can be used (or other equivalent or comparable material) due to its favorable properties and sinterability. In embodiments, the material for the matrix powder can comprise any amount of the constituent components between 0-100% based on weight. For example, in preferred embodiments a powder such as PMN-25PZ-35PT, or PMN-30PZ-30PT, or PMN-20PZ-40PT can be used. Further for example, if desired, a material comprising between 10-95% PMN, or from 20-80% PMN, or from 30-70% PMN, or from 40-60% PMN, such as preferably about 35%, or 36%, or 37%, or 38%, or 39%, or 40%, or 41%, or 42%, or 43%, or 44%, or 45% PMN can be used. Likewise, the powder material can comprise from 10-90% PZ or PT, or from 25-85% PZ or PT, or from 35-75% PZ or PT, or from 45-55% PZ or PT, such as preferably 20-30% PZ or PT, for example, 21%, or 22%, or 23%, or 24%, or 25%, or 26%, or 27%, or 28%, or 29% or 30%, or 31%, or 32%, or 33%, or 34% or 35% PZ or PT. One of skill in the art would know that these ratios can be adjusted according to the particular characteristics desired in the final ceramic product. Even further preferred compositions comprise a PMN:PZT ratio ranging from 0:100 to 100:0, such as about 90:10, 80:20, 70:30, 60:40, 50:50, 40:60, 30:70, 20:80, or 10:90. For example, especially preferred are such compositions comprising a PMN:PZT ratio between 35:65 to 65:35.

The PMN-PZT precursor can be synthesized by any conventional solid state reaction technique. More particularly, in this example, a mixture of $2PbC_{O3}\cdot Pb(OH)^2$ (99.9%, Sigma Aldrich, St. Louis, Mo.), $MgN_{b2O5}$ (99.9%, Alfa Aesar, Ward Hill, Mass.), $N_{b2O5}$ (99.9%, Alfa Aesar, Ward Hill, Mass.), nano-$Zr_{O2}$ (30~60 nm, Advanced Materials LLC, Manchester, Conn.), nano-$Ti_{O2}$ (~40 nm, Advanced Materials LLC), nano-ZnO (~30 nm, Advanced Materials LLC) powder, and $Mn_{O2}$ (99.9%, Alfa Aesar) was ball-milled in ethanol for 48 hours using $Zr_{O2}$ (Tosoh USA, Grove City, Ohio) ball-milling media. After drying, the mixture was calcined at 750° C. for 2 hr. The calcined powder was ball-milled with 1 wt % PbO (99.9%, Sigma Aldrich, St. Louis, Mo.) for 48 hr. Excess PbO was used as a liquid sintering aid and to compensate for PbO evaporation at the high temperature.

After drying, the powder was sieved through 170 mesh sieve. The particle size of this powder has a diameter of 100~200 nm. In embodiments, it is not critical that the powder have a particular particle size, however, and a range of particle sizes can be used. For example, the particles can be less than 1000 nm, such as about 50-800 nm, or from 75-750 nm, or from about 150-500 nm, such as from 200-300 nm and so on. In preferred embodiments, the particle size of the powder is about 80-250 nm, such as from 90-180 nm, or from 100-150 nm. In preferred embodiments, the particle size of the material used for the matrix is smaller than that of the template material particle size. Further, combinations of different particle sizes and/or ranges of particles sizes may also be used, especially combinations of the particle sizes indicated above.

A template for seeding is also prepared. In preferred embodiments, a barium titanate ($BaTiO_3$) template is used, such as $BaTiO_3$ (BT) platelets, for texturing the PMN-PZT. The templates in this example were synthesized using the following reaction steps:

$$2Bi_2O_3 + 3TiO_2 \rightarrow Bi_4Ti_3O_{12} \tag{1}$$

$$Bi_4Ti_3O_{12} + BaCO_3 + TiO_2 \rightarrow BaBi_4Ti_4O_{15} + CO_2 \tag{2}$$

$$BaBi_4Ti_4O_{15} + 3BaCO_3 \rightarrow 4BaTiO_3 + 2Bi_2O_3 + 3CO_2 \tag{3}$$

In the first step (Eq. (1)), $Bi_4Ti_3O_{12}$ microcrystals with plate-like morphology were synthesized by molten salt methods. Generally, $Bi_2O_3$ (99%, Alfa Aesar, Ward Hill, Mass.) and $TiO_2$ (99.5%+, Alfa Aesar) powders were ball-milled in ethanol for 48 hr with the same weight of NaCl (99.0%+, Alfa Aesar) and KCl (99%, Alfa Aesar) mixture (Na:K=1:1 in mol) using $ZrO_2$ (Tosoh USA, Grove City, Ohio) ball-milling media. After drying, the mixed powder was heated at 1050° C. for 1 h. Next the NaCl and KCl salts were removed by washing with deionized water.

In the second step (Eq. (2)), $Bi_4Ti_3O_{12}$ microcrystals were converted into $BaBi_4Ti_4O_{15}$ microcrystals. Generally, the synthesized $Bi_4Ti_3O_{12}$ microcrystals were mixed with $BaCO_3$ (99.8%, Alfa Aesar), $TiO_2$ (99.8%, Alfa Aesar), $BaCl_2$ (99%, Alfa Aesar) and KCl (99%, Alfa Aesar) powders by magnetic stirring in ethanol for 24 hours. The weight ratio between $Bi_4Ti_3O_{12}+BaCO_3+TiO_2$ mixture and $BaCl_2+$KCl salt mixture (Ba:K=1:2 in mol) was maintained at approximately 1:1. After drying, the mixed powder was reacted at 1050° C. for 3 hours. The salts were removed by washing with deionized water. The resultant $BaBi_4Ti_4O_{15}$ microcrystals were found to maintain the original platelet shape of $Bi_4Ti_3O_{12}$ microcrystals.

In the third step, $BaTiO_3$ templates were obtained by a topochemical reaction between $BaBi_4Ti_4O_{15}$ microcrystals and $BaCO_3$. The $BaBi_4Ti_4O_{15}$ microcrystals were mixed with $BaCO_3$ powder ($BaBi_4Ti_4O_{15}$: $BaCO_3$=1:4 in mol) and the same weight of NaCl—KCl salts by magnetic stirring in ethanol for 24 hours. The mixture was dried and subsequently reacted at 950° C. for 3 hours. Next the $Bi_2O_3$ by product was removed and the salts were washed with deionized water. The resultant $BaTiO_3$ microcrystals showed platelet shape with length of ~10 μm and aspect ratio of ~20. Microcrystal size may vary depending on the material used and the processing techniques applied. Preferred compositions can have a platelet length in one or more dimension ranging from about 1-50 μm. For example, the templates can have a width and/or length of about 2-5 μm, or about 7-10

μm, or about 12-20 μm, or about 22-30 μm, or about 25-40 μm, or about 30-50 μm. In embodiments of the invention the template microcrystals can have an aspect ratio ranging, for example, from 1 to 50. In the context of this specification, the aspect ratio is the width divided by the length of the particle. In preferred embodiments, the aspect ratio of the microcrystals ranges from about 2-30, such as about 5-25, or about 10-15, or about 18-22, or about 12-50, for example.

It has been found that controlling particle morphology is very useful for obtaining ceramics with high texture levels and desirable anisotropic properties. In particular, it has been found in general that the higher the particle aspect ratio before firing, the higher the texture level in the resultant composition. $BaTiO_3$ microcrystals with high aspect ratio were used for producing textured PMN-PZT ceramics to obtain the desired texturing of the final product.

Fabrication of PMN-PZT green tape by tape-casting can be performed as follows. The PMN-PZT matrix powder synthesized above is used to prepare a slurry for tape casting. More specifically, 100 g synthesized PMN-PZT matrix powder is mixed with 55 g organic binder (Ferro 73225, Vista, Calif.) in 45 g toluene/ethanol solvent and ball milled for 24 hours. Then 5 vol % BT templates were dispersed into the slurry and mixed by magnetic stirring for 24 hours. Excess toluene is removed by evaporation until the slurry reaches a solid content of 80% or a viscosity of 200 mPa·s. The prepared slurry was poured into the reservoir of tape caster and casted through the doctor blade with a gap of 200 μm at rate of 40 cm/min, using 75 um thick silicone-coated mylar (polyethylene terephthalate) as a carrier film. The doctor blade or equivalent device can be used to orient the template particles within the matrix to a desired degree and orientation. For example, the sample can also be processed by extrusion through an opening that directs the template particles in a particular desired orientation. The cast slurry was dried at room temperature. Six layers of PMN-PZT green tapes were stacked and laminated using a uniaxial hot press at 80° C. to achieve a single thick piezoelectric layer. In embodiments, any number of layers of material can be used to prepare the piezoelectric layer, including for example from 1-50 layers, such as from 2-40 layers, or from 3-30 layers, or from 4-20 layers, or from 5-15 layers, or from 6-10 layers, such as 7, 8, or 9 layers and so on. It is not critical the number of layers that are used and depending on a particular application more or less layers may be desirable to achieve a particular result.

If a ceramic material is desired without an electrode, the sample at this point can be subjected to sintering to complete the process and convert the green body into the ceramic. Details for a representative sintering process are provided below.

Another step in preparing compositions of the present invention includes fabricating the multilayer textured piezoelectric ceramics. Generally, in this example a commercial silver paste (9770, DuPont, N.C., USA) was screen printed on the top of the piezoelectric layer using 325 mesh stainless steel screen, and a dried electrode layer with thickness of 10~20 um was formed. In embodiments, the electrode material is printed on opposing outer layers of the piezoelectric layer. The compositions of the invention can be prepared with or without an electrode and for embodiments with an electrode, the electrode is provided with a thickness preferably of less than about 100 um, such as from about 1-90 um, or for example from about 2-80 um, or 3-75 um, or from 5-60 um, or from 8-15 um, or from 25-50 um and so on. Preferred embodiments comprise an electrode with a thickness of about 5-15 um, such as from about 7-12 um, or about 10 um. The electrode print patterns can be of any configuration desired for a particular application. Once applied to the substrate, the electrode print patterns are dried. Here, the electrode print patterns were dried at room temperature for about 10 minutes, and then dried at 150° C. for another 10 minutes.

The printed tape was cut, stacked and laminated at 80° C. under pressure of 20 MPa for 15 min. The pressure stages of methods of the invention (preparing the single layer piezoelectric material before the electrode is applied or preparing the multilayer structure after the electrode is applied) can be altered according to the particular material being compressed and/or the temperature used. For example, at lower temperatures, more pressure may be desired to achieve the same or similar effect. In preferred embodiments, the temperature at the compression stage(s) can range from about 50-125° C. and the pressure can range from 3-40 MPa and is held for about 3 minutes to 2 hours. Other temperatures that may be used during compression of the material include from about 60-100° C., or from about 70-90° C., or more preferably from about 75-85° C., and most preferably around 80° C. Preferred pressure ranges are from 5-30 MPa, such as from 10-25 MPa, or from 15-22 MPa, and most preferably around 20 MPa. Other heating times may include from about 5 minutes to 1 hour, such as from about 10-30 minutes and most preferably around 15-20 minutes. Any combination of these times, pressures, and temperatures can be used to compress a particular sample in a desired manner according to the invention.

Other layering techniques that can be used prior to laminating, include that the printed tape can be folded to stack the piezoelectric layers and the electrode in an alternating manner and then laminated at a desired temperature and pressure for a sufficient amount of time.

To remove the organic binder, the laminated green tapes were heated to 400° C. with a heating rate of 0.3° C./min and holding for 2 hours, and then isostatically pressed under 200 MPa for 1 minute at room temperature. Lower temperatures are preferred at this stage of the process, for example, from 200-600° C., such as from 300-500° C. and most preferably around 400-450° C. With any of the method steps discussed in this specification, if lower temperatures are used, then longer incubation times may be needed. In embodiments, the samples can be heated from 30 minutes to 2 days, with preferred heating times around 1 hour to 6 hours, such as from 2-3 hours. As with the earlier compression stages outlined above, this further stage of compression can be performed at any level ranging from 20-400 MPa. In embodiments, this stage of compression at the intermediate temperature is performed at about 50-300 MPa, such as from about 75-25 MPa, or from 100-225 MPa, such as from 150-200 MPa.

Next the samples were embedded in calcined PMN-PZT powders containing 3 wt % excess PbO within a closed crucible and sintered at 800~950° C. for 2 hours in the air. Any ceramic material can be processed in this manner, especially the PMN-PZT precursors detailed in this specification. If a piezoelectric material without an electrode is desired, the sintering step can be performed after preparation of the green body into a desired shape. Sintering for any composition of the invention is preferably conducted below about 950° C., such as from about 825-940° C., or from about 850-935° C., or from about 870-920° C., or from about 900-930° C., and so on. Sintering can be performed for about 2 hours or no more than 2 hours at this temperature, with longer sintering times possible with lower temperatures.

For comparison, randomly oriented polycrystalline PMN-PZT ceramics were also prepared for property comparison by the same procedure without adding BT template. The sintered multilayer textured samples were terminated using low temperature silver ink, and then curing at 650° C. for 15 minutes.

The crystal structure of textured PMN-PZT polycrystalline material was determined using x-ray diffraction (XRD, PANalytical X'Pert, CuKα, Philips). The degree of pseudo-cubic texture was determined by the Lotgering factor method. A scanning electron microscope (SEM, FEI Quanta 600 FEG, Philips) was used to analyze the morphology of template and microstructure of the sintered samples. All the samples were poled at 30 kV/cm for 15 minutes at room temperature. The permittivity ($\varepsilon_{33}^T$) and dielectric loss (tan δ) of poled samples were measured by using a multi-frequency LCR meter (HP7274A). The polarization vs. electric field and strain vs. electric field curves were measured by using a modified Sawyer-Tower circuit (Precision Premier II, Radiant Technologies Inc.) combined with a linear variable differential transducer (LVDT) driven by a lock-in amplifier (model SR830, Stanford Research Systems). The piezoelectric coefficient $d_{33}$ was measured by using a $d_{33}$-meter (model YE 2730A, APC International Ltd.).

FIG. 1 shows the scanning electron microscopy (SEM) image of a polished cross section for textured PMN-PZT with Ag inner electrode co-fired at 925° C. for 2 hours. A dense microstructure is observed, and the interface between the textured PMN-PZT piezoelectric layer and the Ag inner electrode demonstrates good adhesion. No crack or delamination of the piezoelectric layer was observed.

Shown in FIGS. 2A-B are cross-sectional SEM images of textured and random fracture samples to illustrate the microstructure of the samples in more detail. As illustrated, the textured samples show a brick wall-like microstructure with well aligned (i.e., crystal faces in the same or substantially the same plane) BT templates (black lines) in the matrix as shown in FIG. 2A, while the random ceramics shows homogeneous equiaxed grains (FIG. 2B). The well-oriented grains microstructure in the textured sample indicates high texture degree.

To characterize the texture degree, an XRD pattern was recorded for the samples as shown in FIG. 3. As illustrated, the peaks labeled 100 and 200 are much higher in the textured sample than the corresponding peaks for the random oriented sample. Compositions of the invention have a high texture quality. Preferably the texture degree is about 90% or higher calculated by the Lotgering factor method (measure of the degree of orientation). In embodiments, the degree of texture of the compositions (expressed as the Lotgering factor) can range from between 0-100%, such as from 5-50%, or from about 10-40%, or from 20-30%, or from 45-99%, such as from 60-95%, or from 75-98%, or from about 80-97%, such as 85-96%, or from 91-94%, and so on. The degree of texturing in preferred compositions of the invention ranges from 85-100% and any degree(s) within this range, such as 91%, 92%, 93%, 94%, 95%, 96%, 97%, 98%, 99% or higher.

To evaluate the properties of co-fired multilayer textured piezoelectric materials, three-layer piezoelectric ceramics were fabricated, and the general representative structure is shown in FIG. 4. Again, any number of piezoelectric layers can be used with the preferred number ranging from 1-10, such as from 2-9, or from 3-8, or from 4-7, or from 5-6 layers.

FIGS. 5A-B show the strain behavior of the trilayer textured ceramic compared against a random bulk ceramic. More particularly, FIGS. 5A-B are graphs showing (A) strain vs. electric field curves for different PMN-PZT materials, including trilayer textured ceramic (T-3), single layer textured (T-1), random ceramic (R-1) and single crystal (SC) and (B) strain vs. driving voltage for textured ceramics: single layer (T-1, the thickness is 0.54 mm) and trilayer (T-3, the thickness of each layer is 0.18 mm). As shown in FIG. 5A, under the driving field of 50 kV/cm, the strain of trilayer textured ceramic is up to 0.44%, which is about 2.5 times that of the random bulk ceramic. Meanwhile, the driving voltage shows a 3× decrease. Thus, it can be seen that the properties of textured ceramics show an improvement as compared with random ceramics and that the properties of the textured ceramics are close to that of single crystal. This indicates that when prepared by a co-firing process, multilayer textured ceramics show better performance than single crystal.

FIG. 6A shows the XRD patterns of textured ceramics co-fired at different temperatures. All patterns display pure pervoskite structure without pyrochlore phase. There are no other peaks corresponding to Ag or related compounds, which indicates no detectable Ag migration or chemical reaction with PMN-PZT. With an increase of temperature, the intensities of 00l peaks increase while others decrease, indicating the increase of texture degree. This means the crystallographic planes of the seed crystals have approximately the same orientation, for example, parallel or substantially parallel to one another. FIG. 6B shows the texture degree evaluated by Lotgering factor as a function of co-firing temperature. The Lotgerting factor increase rapidly from 800° C. and becomes saturation after 850° C. The samples co-fired at 925° C. have about a 90% textured degree.

Texture development strongly correlates with microsturcture evolution. The grain growth of matrix grains on aligned templates is the texture formation process. FIGS. 7A-F are cross-sectional SEM images of textured ceramics (fracture) co-fired at different temperatures: (a) 400° C.; (b) 800° C.; (c) 850° C.; (d) 900° C.; (e) 925° C.; (f) 950° C. BT templates (black lines) were well aligned in the matrix. The matrix particles started to nucleate and grow from the BT template from 800° C. The growth distance for the sample co-firing at 850° C. rapidly increases to about 5 μm. Most of matrix particles have been consumed at 900° C. Texture is fully developed above 925° C. This microstructure evolution is consistent with the texture development as indicated by XRD.

FIGS. 8A-D are cross-sectional SEM images of textured ceramics (polished) co-fired at different temperatures: (a) 900° C.; (b) 925° C.; (c) 950° C.; (d) 925° C. The images are provided at high magnification. The samples have a full density above 900° C. The good sinterability of textured PMN-PZT is due to fine grain particles (100–200 μm) and the addition of PbO liquid sintering aid. It is suspected that the liquid phase promotes the sintering and texture formation because a mass transport in a liquid is faster than that of diffusion in a solid. The interface between the textured PMN-PZT piezoelectric layer and the Ag inner electrode has good adhesion. From FIGS. 8A-D, it also can be observed that there is no crack and delamination observed. It is well known that delamination between the electrode and the ceramic can be one of the principal causes of failure of MLA; they can act as nuclei for crack propagation and fatigue under applied electric fields or stress. The high sinterability of PMN-PZT shifts the densification to low temperature and reduces the sintering shrinkage mismatch between the piezoelectric ceramic and the metal electrode. Therefore, defects and delamination at the processing stage has been minimized or avoided by this technique.

In addition to good adhension between piezoelectric layers and inner electrodes, the electrode-ceramic interface can sometimes prove critical to overall performance of the device. Several different interfacial phenomena have been reported in multilayer ceramics including interdiffusion, non-stocichiometry, alloy formation, and chemical reactions.

From the above results, it can be seen that the multilayer textured PMN-PZT co-fired with Ag electrode at 925° C. has good density, high texture degree and good electrode-ceramic interface. To evaluate the properties of multilayer co-fired textured piezoelectric materials, three-layer piezoelectric ceramics co-fired at 925° C. have been fabricated for testing, and the structure is shown in FIGS. 9A-D.

More particularly, FIGS. 9A-D are (A) SEM and (B-D) EDS mapping images of textured ceramic/Ag inner electrode co-fired at 925° C. There is clear interface between matrix and template, and no obvious interfacial reaction and diffusion has been further confirmed by line scanning analysis as shown in FIG. 10. FIGS. 11A-C are (A)-(B) schematic diagrams of monolayer and MLA, respectively, and (C) corresponding optical images.

FIGS. 12A-B are graphs showing (A) capacitance and (B) dielectric loss of co-fired multilayer ceramics with different end connection. To confirm the electrical connection and contact, especially the continuity of inner electrode and end electrode, the capacitance and dielectric loss of co-fired multilayer ceramics were measured as shown in FIGS. 12A-B. With different end connections, the capacitance ratio is close to 1:3:9 at 1 kHz, indicating good inner electrode connection. For comparison, it also can be seen that there is obvious clamp effect in case of no end connection.

FIGS. 13A-B are graphs showing the dielectric permittivity and loss of (A) monolayer and (B) trilayer co-fired samples. The Tc of co-fired samples increases 12° C. due to the introduction of Ag inner electrode.

To confirm that there is no significant Ag migration into the piezoelectric layers, additional tests were performed. FIGS. 14A-D are graphs showing impedance of (A) monolayer and (B) trilayer co-fired samples measured at different temperature; and (C) DC conductivity $\sigma_{dc}$ and (D) relaxation time ($\tau$) of monolayer and trilayer co-fired samples measured at different temperatures. The activation energy of the DC conductivity $\sigma_{dc}$ and relaxation time ($\tau$) of monolayer and trilayer co-fired samples is very close, which suggests Ag has no very significant influence on the conductivity mechanism.

By combining this TGG method with low-temperature co-firing ceramics (LTCC) techniques, we successfully co-fired multilayer textured piezoelectric ceramic materials with metal inner electrodes at temperature as low as 925° C., which silver could be used. The resulting multilayer textured piezoelectric ceramics have significantly enhanced electromechanical performance. In case of tri-layer, the strain shows a 2.5× increase and the driving voltage shows a 3× decrease compared with random ceramics, which demonstrates this material has promising applications as actuators, ultrasonic transducers, and energy harvesters.

Piezoelectric composites are also included within the scope of the invention. More particularly, giant self-biased magnetoelectric coupling in co-fired textured layered composites has been demonstrated.

For example, co-fired magnetostrictive/piezoelectric/magnetostrictive laminate structure with silver inner electrode were synthesized and characterized. Here, the integration of textured piezoelectric microstructure with the cost-effective low-temperature co-fired layered structure to achieve strong magnetoelectric coupling is achieved.

Using the co-fired composite, a strategy was developed based upon the hysteretic response of nickel-copper zinc ferrite magnetostrictive materials to achieve peak magnetoelectric response at zero DC bias, referred to as self-biased magnetoelectric response. Fundamental understanding of self-bias phenomenon in composites with single phase magnetic material was investigated by quantifying the magnetization and piezomagnetic changes with applied DC field. The contribution arising from the interfacial strain and inherent magnetic hysteretic behavior of copper modified nickel zinc ferrite was delineated towards self-bias response.

Generally, the magnetoelectric (ME) effect is defined as the change in dielectric polarization (P) of a material under an applied magnetic field (H) or an induced magnetization (M) under an external electric field (E). See W. Eerenstein, N. D. Mathur, and J. F. Scott, Nature 442, 759 (2006) and N. A. Spaldin, and M. Fiebig, Science 309, 391 (2005). ME coupling of magnetic and electric order parameters can be used in various applications such as magnetic field sensors, transducers, filters, phase shifters, and magnetic switches. See C. W. Nan, M. I. Bichurin, S. X. Dong, D. Viehland, and G. Srinivasan, J. Appl. Phys. 103, 031101 (2008). It has been shown both experimentally and theoretically that the strain-mediated ME coupling in magnetostrictive-piezoelectric layered composite or laminate is several orders of magnitude larger as compared to single phase materials. See C. W. Nan, M. I. Bichurin, S. X. Dong, D. Viehland, and G. Srinivasan, J. Appl. Phys. 103, 031101 (2008) and G. Srinivasan, Annu Rev. Mater. Res. 40, 153 (2010). Giant magnetoelectric (GME) effect has been reported in a variety of magnetostrictive-piezoelectric laminate composites consisting of ferrite, Terfenol-D, and Metglas as magnetostrictive phase and Pb(Zr,Ti)O$_3$ (PZT) and Pb(Mg$_{1/3}$Nb$_{2/3}$)O$_3$—PbTiO$_3$ (PMN-PT) as piezoelectric phase. See, e.g., C. W. Nan, M. I. Bichurin, S. X. Dong, D. Viehland, and G. Srinivasan, J. Appl. Phys. 103, 031101 (2008); see also G. Srinivasan, Annu Rev. Mater. Res. 40, 153 (2010); see also S. X. Dong, J. Y. Zhai, J. F. Li, and D. Viehland, Appl. Phys. Lett. 89, 252904 (2006); see also Y. J. Wang, D. Gray, D. Berry, J. Q. Gao, M. H. Li, J. F. Li, and D. Viehland, Adv. Mater. 23, 4111 (2011); see also J. Ma, J. M. Hu, Z. Li, and C. W. Nan, Adv. Mater. 23, 1062 (2011); see also R. C. Kambale, D. Y. Jeong, and J. Ryu, Adv. Condens. Matter Phys. 824643 (2012). In these composites, the measured ME coefficient was found to be directly related to the effectiveness of elastic coupling at the interface of two phases.

FIGS. 15A-D are schematic diagrams of different types of layered magnetoelectric (ME) composite structures. More particularly, shown are four types of layered ME composite structure (type A-D) synthesized by different processing techniques. The widely used method for synthesis of laminate composites is bonding of the magnetostrictive layer (such as Metglas, Terfenol-D) and the piezoelectric layer (such as PZT, PMN-PT) using epoxy resin (FIG. 15A). This method limits the misfit strain at the interface arising due to thermal expansion mismatch between the layers and atomic inter-diffusion and/or chemical reaction between the layers. However, the epoxy layer is much softer than both than the magnetostrictive alloy and ferroelectric ceramic and thus it will dampen the generated strain resulting in loss of efficiency. The Metglas/piezofiber push-pull structure as shown in FIG. 15B was developed to reduce the structural clamping and utilize longitudinal operational mode ($d_{33}>2d_{31}$ since Poisson's ratio is smaller than 0.5). In this structure, an inter-digitized (ID) electrode pattern was attached on both surfaces of the piezo-fiber (40×2×0.2 mm³) layer using epoxy resin. The ME voltage coefficient ($\alpha_{ME,Q}$) of this type-B structure is nearly an order of magnitude higher than those of type-A ME laminates (FIG. 15A). See S. X. Dong, J. Y. Zhai, J. F. Li, and D. Viehland, Appl. Phys. Lett. 89, 252904 (2006) and Y. J. Wang, D. Gray, D. Berry, J. Q. Gao, M. H. Li, J. F. Li, and D. Viehland, Adv. Mater. 23, 4111 (2011). However, the epoxy layer also limits the ME response due to low mechanical strength, and contributes towards the noise floor and aging. See M. H. Li, D. Berry, J. Das, D. Gray, J. F. Li, and D. Viehland, J. Am. Ceram. Soc. 94, 3738 (2011). Furthermore, the high cost of raw materials (large dimension PMN-PT single crystal fibers) and manual fabrication process (polishing on the order of 200 μm followed by lamination) presents challenge in implementation at commercial scale.

In contrast to bonding, co-firing of a layered ME composite provides compatibility with current industrial production processes commonly used for fabrication of multilayer capacitors (MLCs). Recently, an ME sensor based upon Ni—BaTiO$_3$ MLCs was reported which laid the foundation for future commercialization of this technology. See C. Israel, N. D. Mathur, and J. F. Scott, Nat. Mater. 7, 93 (2008). As shown in FIG. 15C, this type-C structure consists of alternate BaTiO$_3$ thin film layers and ferromagnetic Ni internal electrodes. The magnitude of $\alpha_E$ was found to be 7.1 mV cm$^{-1}$ Oe$^{-1}$ which is extremely low but the projected overall cost was also extremely low. In order to increase the ME effect while keeping the cost down, materials with large magnetostrictive and piezoelectric coefficient are needed in the co-fired configuration. Srinivasan et al. have reported the performance of PZT/NiFe$_2$O$_4$ layered composites synthesized by tape casting and co-firing process. See G. Srinivasan, E. T. Rasmussen, J. Gallegos, R. Srinivasan, Y. I. Bokhan, and V. M. Laletin, Phys. Rev. B 64, 214408 (2001). A high $\alpha_E$ of 400 mV cm$^{-1}$ Oe$^{-1}$ was found for the PZT/NiFe$_2$O$_4$ multilayer stacks (2 to 21 layers). However, high co-firing temperature (1400-1500 K) and no inner electrode limited the poling of piezoelectric materials and the process was not compatible with low-temperature co-fired ceramics (LTCC) process required for capacitors, inductors, resistors, transformers, and hybrid circuits.

Besides the consideration of the effective strain coupling between the magnetostrictive phase and piezoelectric phase, the ME coefficient is strongly dependent upon the intrinsic properties of each phase. For 2-2 type laminate composites, the transverse ME coefficient ($\alpha_{E,31}$) is given as:

$$\alpha_{E,31} = \frac{E_3}{H_1} = \frac{-v(1-v)(^m q_{11} + ^m q_{21})^p d_{31}}{^p \varepsilon_{33}(^m s_{12} + ^m s_{11})v + ^p \varepsilon_{33}(^p s_{11} + ^p s_{12})(1-v) - 2^p d_{31}^2(1-v)} \quad \text{Eq. (1)}$$

where $E_k$ and $H_k$ are vector components of the electric and magnetic field; $s_{ij}$ is an compliance coefficient; $d_{ki}$ is a piezoelectric coefficient; $q_{ki}$ is a piezomagnetic coefficient; and $\varepsilon_{kn}$ is an permittivity. See M. I. Bichurin, V. M. Petrov, and G. Srinivasan, Phys. Rev. B 68, 054402 (2003). The superscripts "m" and "p" represent the magnetostrictive and piezoelectric phase respectively. This relationship clearly reflects the important role of the piezomagnetic coefficient towards achieving a large magnetoelectric response. At the same time, it also shows the fundamental limitation of the piezoelectric material. For high $\alpha_E$, one would require high $d_{ki}$ and low $\varepsilon_{kn}$, but in most of the cases both these coefficients vary in the same direction. Here, the template grain growth (TGG) technique yields suitable microstructure in order to overcome these material challenges. See G. L. Messing, S. Trolier-McKinstry, E. M. Sabolsky, C. Duran, S. Kwon, B. Brahmaroutu, P. Park, H. Yilmaz, P. W. Rehrig, K. B. Eitel, E. Suvaci, M. Seabaugh, and K. S. Oh, Crit. Rev. Solid State 29, 45 (2004); see also Y. K. Yan, K. H. Cho, and S. Priya, Appl. Phys. Lett. 100, 132908 (2012); see also Y. Saito, H. Takao, T. Tani, T. Nonoyama, K. Takatori, T. Homma, T. Nagaya, and M. Nakamura, Nature 432, 84 (2004); see also Y. K. Yan, H. P. Zhou, W. Zhao, and D. Liu, J. Electroceram. 21, 246 (2008); see also E. M. Sabolsky, S. Trolier-McKinstry, and G. L. Messing, J. Appl. Phys. 93, 4072 (2003); and see Y. Yan, Y. U. Wang, and S. Priya, Appl. Phys. Lett. 100, 192905 (2012). Using this technique, two goals were achieved: (1) texturing (grain orientation along the crystallographic direction) of piezoelectric ceramic with engineered domain state similar to that of single crystals to obtain high d values, and (2) suppression of ε of textured piezoelectric ceramic through the use of low ε template seeds.

A co-fired magnetostrictive/piezoelectric/magnetostrictive (M/P/M) laminate structure with Ag inner electrode as shown in FIG. 15D was specifically investigated. Compositions corresponding to Pb(Mg$_{1/3}$Nb$_{2/3}$)O$_3$-32.5PbTiO$_3$ [PMN-PT] and (Ni$_{0.6}$Cu$_{0.2}$Zn$_{0.2}$)Fe$_2$O$_3$ [NCZF] were used as piezoelectric and magnetostrictive materials respectively. Low relative permittivity BT micro-crystals ($\varepsilon_r$=130) were selected as templates. Representative preparation techniques are provided in more detail below and can also be derived from the literature. Y. K. Yan, K. H. Cho, and S. Priya, J. Am. Ceram. Soc. 94 (6), 1784 (2011). More particularly, 0.675Pb(Mg$_{1/3}$Nb$_{2/3}$)O$_3$-0.325PbTiO$_3$ [PMN-PT] powders and (Ni$_{0.6}$Cu$_{0.2}$Zn$_{0.2}$)Fe$_2$O$_3$ [NCZF] powders were synthesized by the conventional mixed oxide method using reagent-grade raw materials of 2PbCO$_3$·Pb(OH)$_2$, MgNb$_2$O$_5$, Nb$_2$O$_5$, TiO$_2$, NiO, CuO, ZnO, and Fe$_2$O$_3$, respectively. According to embodiments of the invention, any PMN-PT or PMN-PZT powder can be used for the matrix. In embodiments, the ratio of PMN:PT or PMN:PZT ranges from between 0:100 to 100:0. In preferred embodiments, the PMN:PT or PMN:PZT ratio ranges from between 10:90 to 90:10, or from 20:80 to 80:20, or from 30:70: to 70:30, or from 40:60 to 60:40, or 50:50. Especially preferred are materials where the piezoelectric layer is formed from a powder with a PMN:PT or PMN:PZT ratio of between about 30:70 to about 35:65, such as about 31:69, or 32:68, or 33:67, or 34:66, or 35:65 and so on. Likewise, any magnetostrictive material can be used for the magnetostrictive layer including Terfenol-D, Metglas, or ferrite, including NCZF type compounds, such as Ni$_{0.8}$Cu$_{0.2}$Zn$_{0.2}$Fe$_2$O$_4$ or Ni$_{0.6}$Cu$_{0.2}$Zn$_{0.2}$Fe$_2$O$_4$.

After drying, the mixture was calcined at 750° C. for 2 h. Calcined powders were ball milled again for 24 h, dried, and sieved. For tape casting, a slurry was prepared by mixing the PMN-PT matrix powder with 55 wt % organic binder (Ferro 73225, Vista, Calif.) in 45% toluene/ethanol solvent and ball milling for 24 hours. Then 1 vol % BaTiO$_3$ (BT) templates were dispersed into the slurry and mixed by magnetic stirring for 24 hours. Excess toluene was removed by evaporation until the slurry reached a solid content of 80%. The slurry was then casted through the doctor blade with gap of 300 μm on silicone-coated Mylar (polyethylene terephthalate) carrier film. The casted slurry was dried at room temperature. NCZF green tapes and random PMN-PT green tapes were fabricated in the same way as textured PMN-PT tape without adding BT template. Six layers of random/textured PMN-PT or NCZF green tapes were stacked and laminated using a uniaxial hot press at 80° C. to achieve a single thick piezoelectric or magnetostrictive layer. A commercial silver paste (9770, DuPont, N.C., USA) was screen printed on top of the piezoelectric layer using 325 mesh stainless steel screen with thickness of 10~20 μm. The printed patterns were dried at room temperature for 10 minutes and then dried at 150° C. for another 10 minutes. The printed tape was diced, stacked and laminated at 80° C. under pressure of 20 MPa for 15 min. The laminated green tapes were heated to 400° C. with a heating rate of 0.3° C. $min^{-1}$, held for 2 hours to burn the organic binder and then sintered at 930° C. for 4 hours in air. The sintered multilayer textured samples were terminated using low temperature silver ink and then cured at 100° C. for 30 minutes. The specimens were poled by applying DC field of 40 kV $cm^{-1}$ for 15 min.

The texture degree was calculated from x-ray diffraction data (XRD, PANalytical X'Pert) by Lotgering factor method. The microstructure was observed by using scanning electron microscopy (SEM, FEI Quanta 600 FEG). The sample was placed in the center of the Helmholtz coil (alternating magnetic field, $H_{AC}$) which was located at the center of electromagnet (DC biased magnetic field, $H_{DC}$). ME voltage coefficient of the laminate was measured at 1 kHz $H_{AC}$ (1 Oe) under various $H_{DC}$ using a lock-in amplifier. The induced P under an applied magnetic field was monitored by using a ferroelectric tester (Radiant: Precision Premier II, USA). The measurement system was based upon modified Sawyer-Tower technique that allows direct measurement of the P behaviour corresponding to the applied H. The sample was placed in the center of a Helmholtz coil which excited $H_{AC}$ from the DRIVE output of the tester. The output from the sample was connected to the RETURN input of the ferroelectric tester. Magnetostriction for NCZF was measured by using the strain gauge and Wheatstone Bridge. The magnetization of the composite was measured by using vibrating sample magnetometer (VSM).

TABLE I

Characteristics of different type of layered ME composites.

| M | P | dE/dH [mV $cm^{-1}$ $Oe^{-1}$, 1 kHz] | Ref. | Characteristics |
|---|---|---|---|---|
| (A) Epoxy Bonding | | | | |
| Ni | PZT | 450 | [1] | Low properties |
| NZF | PZT | 450 | [2] | Low properties |
| Terfenol-D | PMN-PT [SC] | 4300 | [3] | High cost Terfenol-D and single crystal |
| Metglas | PZN-PZT | 150 | [4] | Low properties |
| Metglas | Mn-PZN-PZT | 220 | [4] | Limited thickness of Metglas |
| (B) Epoxy Bonding, Inter Digital Electrodes (IDE) | | | | |
| Metglas | PZT | 22000 | [5] | Complex structure, limited production |
| Metglas | PMN-PT [SC] | 52000 | [6] | High cost single crystal fibers |
| (C) Multilayer Co-firing Ceramics (MLCC) | | | | |
| Ni | BT | 7.1 | [7] | Low-cost, low properties |
| (D) Co-firing, tape casting | | | | |
| CFO | $BaTiO_3$ | 0 | [8] | Pt inner electrode |
| CFO | PZT | 75 | [8] | Pt inner electrode |
| NZF | PZT (20-layer) | 400 | [9] | No inner electrode |
| LSM | PZT | 32 | [10] | No inner electrode |
| NCZF | PZT-PZN | 595 | [11] | Dry pressing (not tape-casting) |
| NCZF | PZT-PZN | 82 | [12] | without inner electrode, 930° C. |
| NCZF | PZT-PZN | 107 | [12] | Ag inner electrode, 930° C. |
| NCZF | Textured PMN-PT | 1346 | This work | Ag inner electrode, 930° C. |

[SC] Abbreviation of single crystal.

The references cited in Table I above are: [1] V. M. Laletin, N. Paddubnaya, G. Srinivasan, C. P. De Vreugd, M. I. Bichurin, V. M. Petrov, D. A. Filippov, Appl. Phys. Lett. 87, 222507 (2005); [2] S. K. Mandal, G. Sreenivasulu, V. M. Petrov, G. Srinivasan, Appl. Phys. Lett. 96, 192502 (2010); [3] S. X. Dong, J. F. Li, D. Viehland, Appl. Phys. Lett. 85, 5305 (2004); [4] K. H. Cho, C. S. Park, S. Priya, Appl. Phys. Lett. 97, 182902 (2010); [5] S. X. Dong, J. Y. Zhai, J. F. Li, D. Viehland, Appl. Phys. Lett. 89, 252904 (2006); [6] Y. J. Wang, D. Gray, D. Berry, J. Q. Gao, M. H. Li, J. F. Li, D. Viehland, Adv. Mater. 23, 4111 (2011); [7] C. Israel, N. D. Mathur, J. F. Scott, Nat. Mater. 7, 93 (2008); [8] G. Harshe, Ph.D. Thesis, Pennsylvania State University, USA 1991; [9] G. Srinivasan, E. T. Rasmussen, J. Gallegos, R. Srinivasan, Y. I. Bokhan, V. M. Laletin, Phys. Rev. B 64, 214408 (2001); [10] G. Srinivasan, E. T. Rasmussen, B. J. Levin, R. Hayes, Phys. Rev. B 65, 134402 (2002); [11] R. A. Islam, Y. Ni, A. G. Khachaturyan, S. Priya, J. Appl. Phys. 104, 044103 (2008); and [12] C. S. Park, S. Priya, J. Am. Ceram. Soc. 94, 1087 (2011).

Figure 16A:
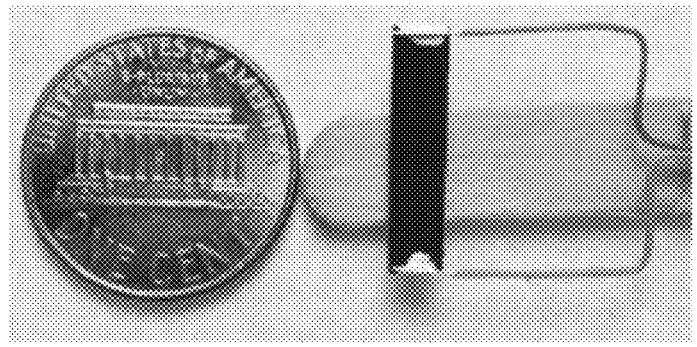
FIG. 16A is an optical image of a co-fired NCZF/Textured-PMN-PT/NCZF (abbreviated as C—N/T/N) laminate composite synthesized at 930° C.

FIG. 16A shows the optical image of co-fired NCZF/Textured-PMN-PT/NCZF (abbreviated as C—N/T/N) laminate composite synthesized at 930° C. for 4 h with dimensions 16×4×0.4 $mm^3$. Co-firing of piezoelectric ceramic layer, Ag metal electrode layer and ferrite ceramic layer is extremely challenging due to the large difference in shrinkage rates and thermal expansion mismatch. By using fine PMN-PT matrix powder and by adjusting the ratio of sintering aid (Cu) content in NZF as described above, it is possible to successfully co-fire the multilayer composite.

Figure 16B:
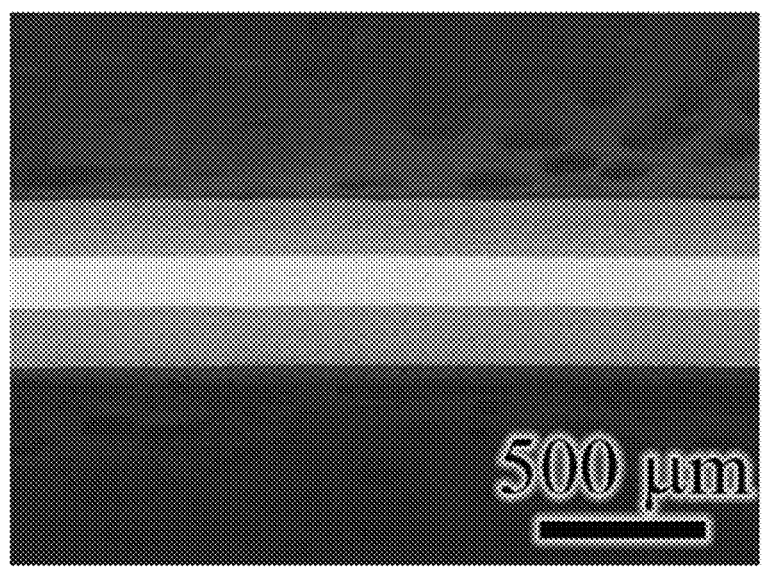
Figure 17A:
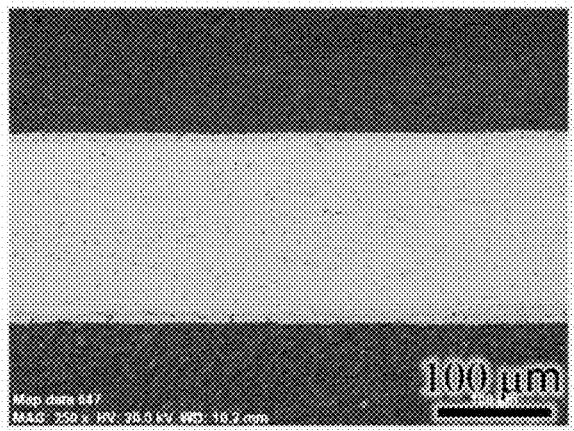
FIGS. 17A-F are SEM images showing element mapping of co-fired NCZF/T-PMN-PT/NCZF laminate.
Figure 17B:
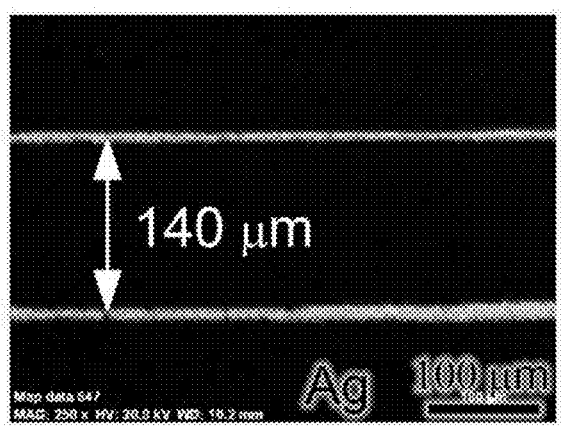
Figure 17C:
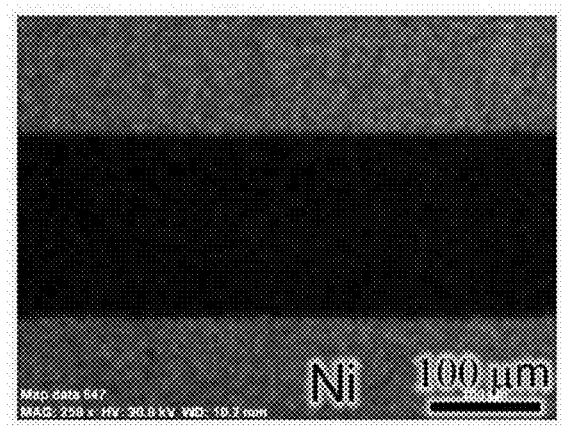
Figures 17D, 17E, 17F:
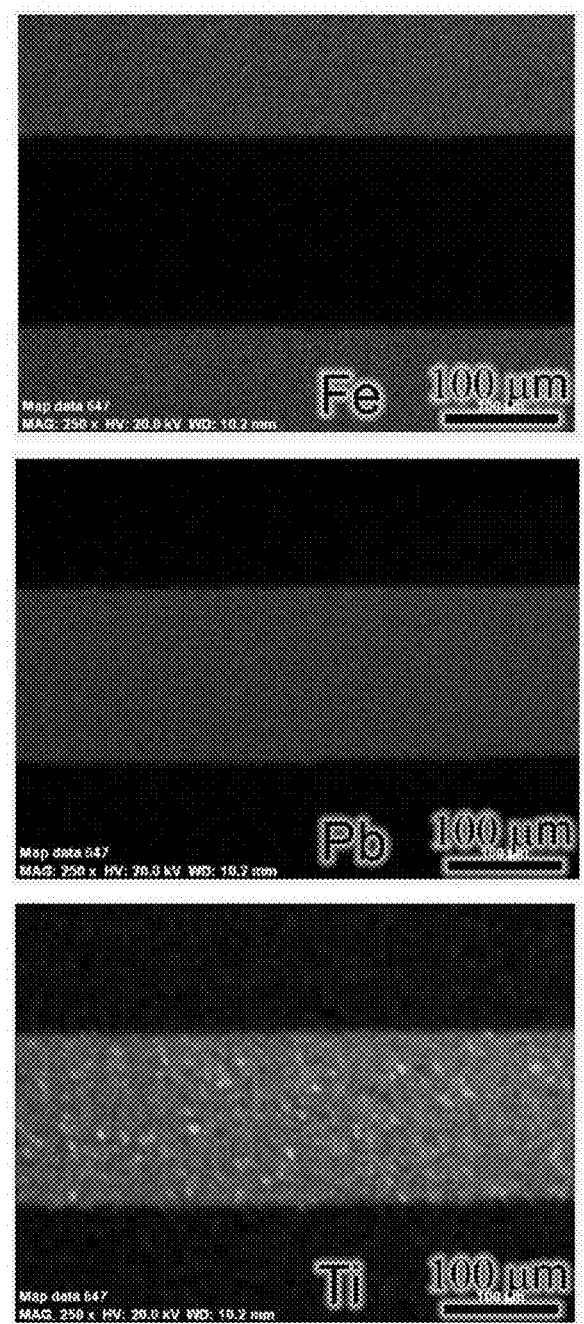
Figure 18A:
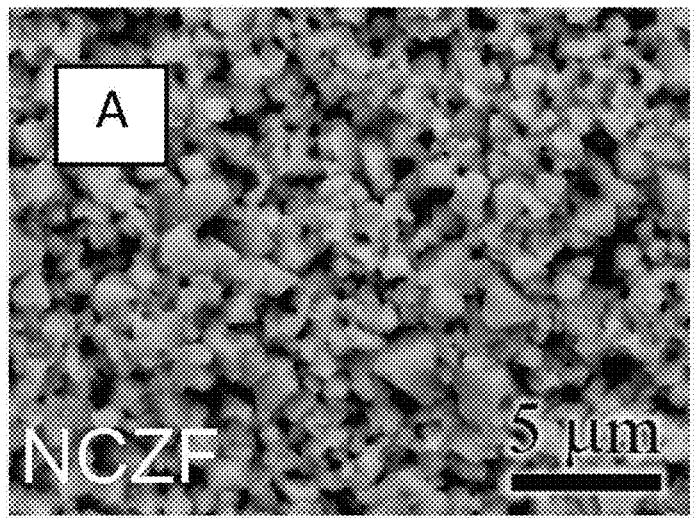
FIGS. 18A-C are fracture cross-sectional SEM images of the different layers of the C—N/T/N composite of FIGS. 17A-F.
Figure 18B:
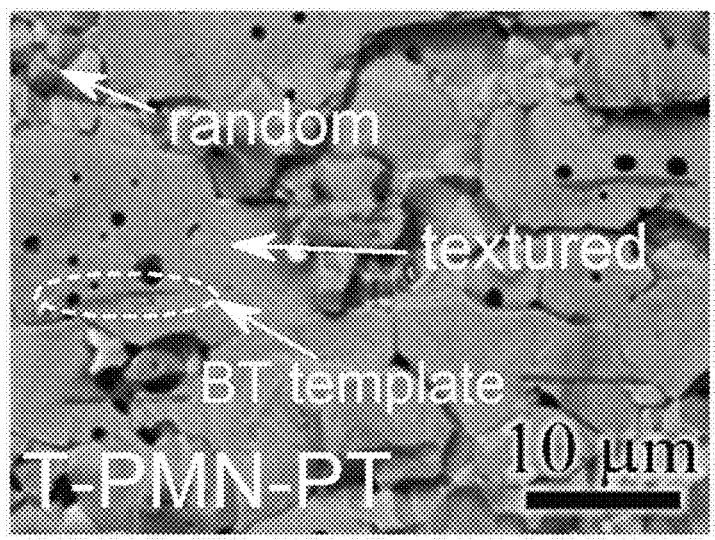
Figure 18C:
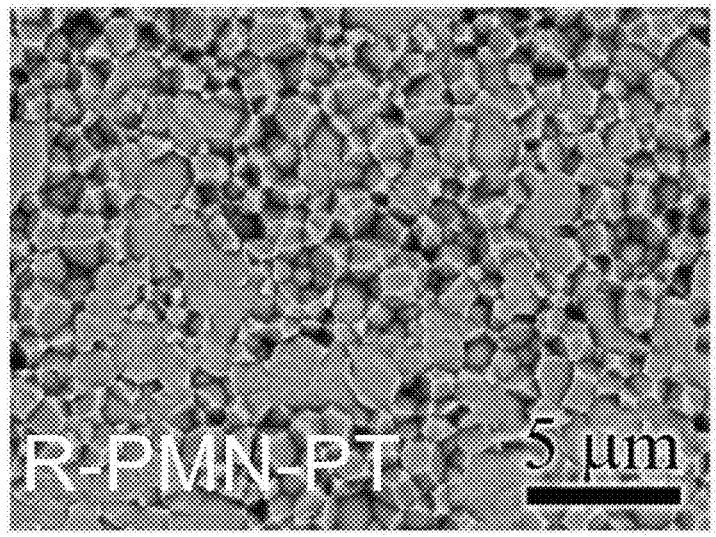
Figure 18D:
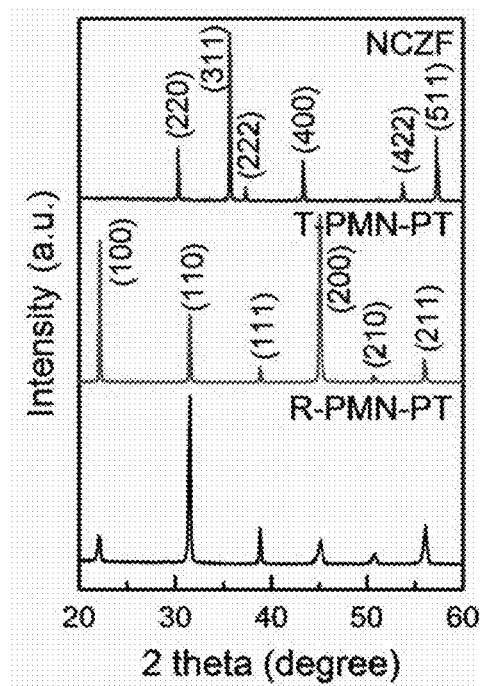
FIG. 18D is a graph of the corresponding planar XRD patterns of the different layers of the C—N/T/N composite of FIGS. 17A-F.

FIGS. 16B-C show the cross-sectional scanning electron microscopy (SEM) images of C—N/T/N composite. There was no trace of delamination or micro-crack and the thickness of textured PMN-PT piezoelectric layer and NCZF magnetoelectric layer was similar. The interfacial atomic diffusion and/or chemical reactions occurring during the sintering process at high temperature were found to be negligible. Energy dispersive spectroscopy (EDS) line scanning analysis results are shown in FIG. 16D indicating the high chemical stability of NCZF, Ag, and PMN-PT. In a prior study conducted on NCZF/PZN—PZT system, the diffusion length for Cu was found to be in the range of 30 See C. S. Park, and S. Priya, J. Am. Ceram. Soc. 94, 1087 (2011). Here, the Ag electrode layer acts as an effective barrier layer for Cu migration and thus provides a sharp interface by limiting the diffusion.

FIGS. 17A-F are SEM images showing element mapping of co-fired NCZF/T-PMN-PT/NCZF laminate. EDS analysis of C—N/T/N cross-sectional area shows the dense microstructure and sharp interface across different layers. The thickness of Ag electrode and PMN-PT piezoelectric layer was 10 μm and 140 μm respectively.

FIGS. 18A-D show the fracture surface SEM images and corresponding planar x-ray diffraction (XRD) patterns of different layers. For textured PMN-PT layer synthesized by TGG method, brick wall-like microstructure with well aligned BT templates (black lines) in the PMN-PT matrix was obtained. Increase of {001} XRD peak intensity and decrease of other peaks clearly indicates the formation of texture. In TGG process, BT template crystals are aligned in PMN-PT matrix powder by tape-casting process. High temperature treatment (or sintering process) results in the nucleation and growth of PMN-PT matrix on the aligned BT template crystals yielding textured ceramics. At the co-firing temperature of 930° C., 66% texture degree was obtained.

FIG. 19A is a graph showing the change in ME voltage coefficient ($\alpha_E$) as a function of DC magnetic field at off-resonance frequency of 1 kHz. Although the magnetostriction of Metglas ($\lambda$=40 ppm) is twice that of NCZF ($\lambda \approx$20 ppm), the maximum $\alpha_E$ of co-fired NCZF/random-PMN-PT/NCZF (abbreviated as C—N/R/N) is two times as that of epoxy bonded Metglas/random-PMN-PT/Metglas (abbreviated as B-M/R/M) laminate. Further improvement was achieved for co-fired textured sample (C—N/T/N). The large enhancement in textured ceramics was related to the formation of "engineered domain state" which facilitates the rotation of polarization toward the direction. See S. E. Park, and T. R. Shrout, J. Appl. Phys. 82, 1804 (1997) and H. X. Fu, and R. E. Cohen, Nature 403, 281 (2000). In FIG. 19A, it can also be observed that there is a strong hysteretic ME response in the co-fired composite. Considering the relation $\alpha \propto q = d\lambda/dH_{DC}$, the effective $\lambda$ behavior was estimated by integrating $\alpha$ with respect to the $H_{DC}$ as shown in FIG. 19B. The epoxy bonded Metglas/PMN-PT/Metglas shows symmetrical $\lambda$-behavior with respect to the $H_{DC}$, while the tendency of $\lambda$ for co-fired composites was found to be asymmetric. The variation of $\alpha_E$ with frequency of applied $H_{AC}$ is shown in FIG. 19C. It can be seen that the maximum $\alpha_E$ displays excellent stability. A giant ME voltage coefficient (>1200 mV cm$^{-1}$ Oe$^{-1}$) at zero-bias was achieved in C—N/T/N composite. FIG. 19D shows the dynamic change in charge (Q) or polarization (P) of ME composite (Radiant: Precision Premier II, USA) measured under the condition of $H_{AC}$=1 Oe at f=1 kHz and $H_{DC}$=0 Oe. ME charge coefficient $\alpha_{ME,Q}$ can be written as:

$$\alpha_{ME,Q} = \frac{dE}{dH} = \frac{dQ}{dH_{AC}} \times \frac{1}{Ct} = \frac{dP}{dH_{AC}} \times \frac{A}{Ct}, \quad \text{Eq. (2)}$$

where C, A, t are the capacitance, area and thickness of the piezoelectric layer, respectively. Large polarization and charge induced by AC magnetic field under zero DC bias, and calculated ME charge coefficient $\alpha_{ME,Q}$ is shown in FIG. 19D further confirming the presence of strong ME effect under zero bias. The time delay of $\alpha_{ME,Q}$ related to $H_{AC}$ can be observed in FIG. 19D, which is attributed to the interface between magnetostrictive and piezoelectric layer. Compared to the ME coefficient of 30 mV cm$^{-1}$ Oe$^{-1}$ obtained for NKNLS-NZF/NUNKNLS-NZF trilayer laminate (40×), ~100 mV cm$^{-1}$ Oe$^{-1}$ obtained for Ni—PZN—PZT bilayer laminate (12×), and ~400 mV cm$^{-1}$ Oe$^{-1}$ obtained for functionally graded Ni—NZFO—PZT laminate composites (3×) at zero-bias, the co-fired composite exhibited extremely high response. See S. C. Yang, C.-S. Park, K.-H. Cho, and S. Priya, J. Appl. Phys. 108, 093706 (2010); see also Y. Zhou, S. C. Yang, D. J. Apo, D. Maurya, and S. Priya, Appl. Phys. Lett. 101, 232905 (2012); and see U. Laletin, G. Sreenivasulu, V. M. Petrov, T. Garg, A. R. Kulkarni, N. Venkataramani, and G. Srinivasan, Phys. Rev. B 85, 104404 (2012). Recently, slightly larger zero-bias magnetoelectric coefficient of 1.65 V cm$^{-1}$ Oe$^{-1}$ in a quasi-one dimensional ME sensor has been reported at 100 Hz compared to our case (1.47 V cm$^{-1}$ Oe$^{-1}$). See Y. Chen, S. M. Gillette, T. Fitchorov, L. Jiang, H. Hao, J. Li, X. Gao, A. Geiler, C. Vittoria, and V. G. Harris, Appl. Phys. Lett. 99, 042505 (2011). However, the co-fired multilayer composite based on LTCC has advantage of integration with other circuit components such as multilayer capacitor, resistor, inductor, and conductor to fabricate fully packaged electronic devices.

Figure 20A:
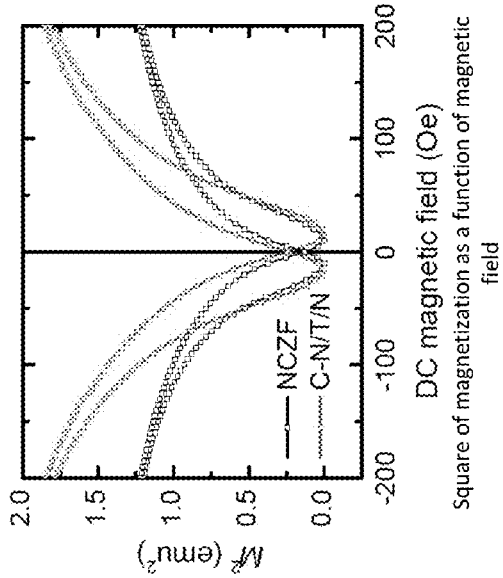
FIGS. 20A-C are graphs showing respectively (A) magnetization-magnetic field (M-H) loops, (B) square of magnetization as a function of magnetic field, and (C) differential of square magnetization-magnetic field [$(dM^2/dH)$-H] plot for pure NCZF (not co-fired) and C—N/T/N structure.

The giant ME response of co-fired composite and self-biased hysteretic behavior can be explained by taking into account the piezoelectric and magnetostrictive characteristics. Figure of merit for the ME composite can be derived as following:

$$\alpha_{ME} = \frac{\partial E}{\partial H} = \underbrace{\left|\frac{\partial E}{\partial D} \times \frac{\partial D}{\partial T} \times \frac{\partial T}{\partial S}\right|}_{P\text{-layer}} \times \underbrace{\left|\frac{\partial S}{\partial H}\right|}_{M\text{-layer}} = \left|\frac{d}{\varepsilon \times s}\right| \times q, \quad \text{Eq. (3)}$$

where E is the output electric field, H is the applied magnetic field, S is the mechanical strain, T is the mechanical stress, D is the electric displacement, d is the piezoelectric constant, $\varepsilon$ is the dielectric constant, s is the elastic compliance of piezoelectric layer (P-layer), and q is piezomagnetic coefficient of magnetostriction layer (M-layer). Since the parameters d, $\varepsilon$ and s of piezoelectric materials are independent of applied magnetic field (H), this investigation focused on the magnetization (M) of NCZF as a function of magnetic field in longitudinal direction by using vibrating sample magnetometer (VSM) as shown in FIG. 20A. The ME behavior can be correlated with magnetostriction ($\lambda$) and magnetization (M) as:

$$\varphi \sim \frac{3\lambda\sigma}{(K + 2\pi M^2)} \text{ or } \lambda \propto M^2, \quad \text{Eq. (4)}$$

where $\varphi$ is the angle of magnetic moments, K and $\sigma$ are the anisotropy constant and stress respectively. See V. K.

Figure 20B:
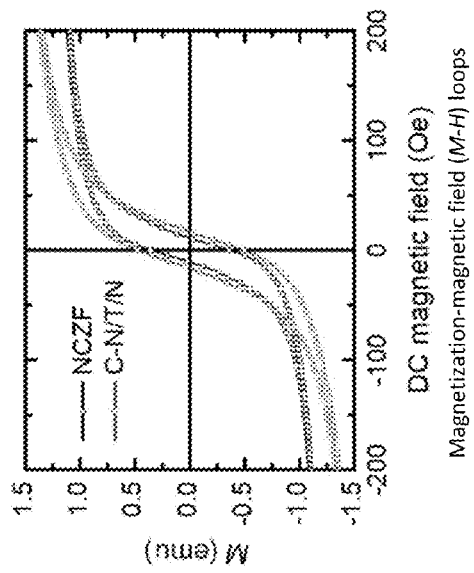
Figure 20C:
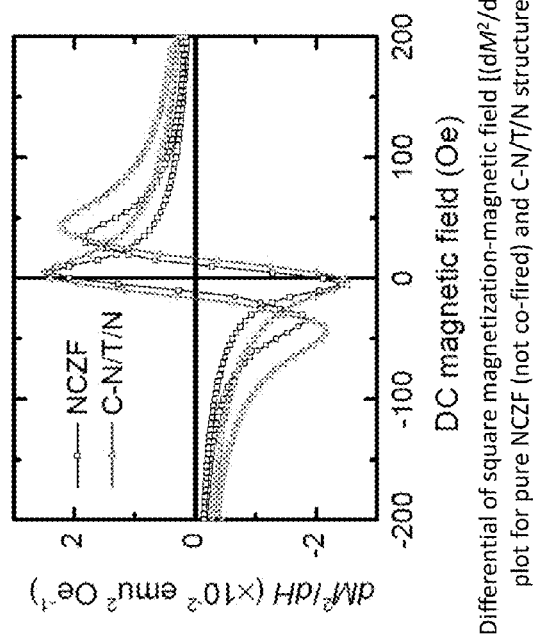

Vlasko-Vlasov, Y. K. Lin, D. J. Miller, U. Welp, G. W. Crabtree, and V. I. Nikitenko, Phys. Rev. Lett. 84, 2239 (2000). As shown in FIGS. 20B and 20C, $M^2$-H and $\partial M^2/\partial H$-H curves can be used to predict the nature of the magnetostriction coefficient ($\lambda$) and piezomagnetic coefficient ($q=d\lambda/dH$). To further confirm the variation of q as a function of $H_{DC}$, in-plane magnetostriction coefficient ($\lambda_{11}$) was measured in parallel to applied $H_{DC}$ by strain gauge method (FIG. 20D). As shown in FIG. 20E, the behavior of in-plane piezomagnetic coefficient ($q_{ij}=d\lambda_{ij}/dH$) was similar to that of $\partial M^2/\partial H$. Due to the inherent hysteresis in NCZF, the magnetostriction coefficient ($\lambda$) is asymmetric and displays "butterfly" like characteristic. The data in FIGS. 20A-E confirms that the self-bias effect is mainly related to the hysteretic response of ferrite layer.

TABLE II

Dielectric and magnetoelectric properties of co-fired layered ME composite (1 kHz).

| Sample | Electrode | $\varepsilon_r$ | tan$\delta$ | dE/dH (max) [mV cm$^{-1}$ Oe$^{-1}$] | dE/dH (zero-bias) [mV cm$^{-1}$ Oe$^{-1}$] |
|---|---|---|---|---|---|
| C—N/R/N | co-fired | 1336 | 1.1% | 827 | 510 |
| C—N/T/N | co-fired | 1135 | 0.7% | 1346 | 1214 |

Compared to epoxy bonded Metglas/PMN-PT/Metglas, the maximum $\alpha_E$ of NCZF/R-PMN-PT/NCZF was 2~3 times higher in magnitude (827 mV cm$^{-1}$ Oe$^{-1}$). As demonstrated, texturing further increases the magnitude of $\alpha_E$ (1346 mV cm$^{-1}$ Oe$^{-1}$) by 63%. Textured composites show low loss due to "engineered domain configuration." Further, the dielectric constant of textured sample was suppressed by using low permittivity BT template crystals. Even further, co-fired textured composites show large $\alpha_E$ under zero-bias of the order of 1214 mV cm$^{-1}$ Oe$^{-1}$. Taking into account Eq. (2) and the results of Table II, the giant ME response of co-fired textured sample can be easily explained. It should also be pointed out that lower losses of textured sample plays an important role in enhancing the $\alpha_E$ which can be understood by taking into account the modified piezoelectric voltage coefficient ($g_{31}$) given as:

$$g_{31}^* = g_{31} \frac{1}{\left(\tan \delta' + \tan \theta' + \frac{C-C_f}{C_f}\right)} \quad \text{Eq. (5)}$$

where $C-C_f/C_f$ is the rate of capacitance change, C is capacitance at a given frequency, $C_f$ is capacitance at 1 kHz, and tan $\delta'$ and tan $\theta'$ are the intensive dielectric loss and piezoelectric loss respectively. See K. H. Cho, C. S. Park, and S. Priya, Appl. Phys. Lett. 97, 182902 (2010).

In conclusion, NCZF/PMN-PT/NCZF layered composite with Ag inner electrodes were successfully co-fired at low temperature (930° C.). The co-fired NCZF/textured PMN-PT/NCZF layered composites exhibited 5× increase in $\alpha_E$ compared to type-A structure (Metglas/PMN-PT/Metglas). Further, these composites exhibited giant self-bias phenomenon which was associated with hysteresis of NCZF magnetostrictive materials. These cost-effective composites with excellent ME properties open the possibility of mass production of numerous magnetoelectric applications as highlighted above.

The present invention has been described with reference to particular embodiments having various features. One skilled in the art will recognize that these features may be used singularly or in any combination based on the requirements and specifications of a given application or design. For example, with respect to particular methods disclosed herein it is understood that any one or more of the method steps can be omitted, added to another method, or performed in a different order than disclosed. Other embodiments of the invention will be apparent to those skilled in the art from consideration of the specification and practice of the invention. Where a range of values is provided in this specification, each value between the upper and lower limits of that range is also specifically disclosed. The upper and lower limits of these smaller ranges may independently be included or excluded in the range as well. All numbers and ranges disclosed above may vary by some amount. As used in this specification, the singular forms "a," "an," and "the" include plural referents unless the context clearly dictates otherwise. While compositions and methods are described in terms of "comprising," "containing," or "including" various components or steps, the compositions and methods can also "consist essentially of" or "consist of" the various components and steps. It is intended that the specification and examples be considered as exemplary in nature and that variations that do not depart from the essence of the invention are intended to be within the scope of the invention.

Further, the references cited in this disclosure are hereby incorporated by reference herein in their entireties, especially for information that is well known in the art for example with respect to compositions comprising, methods of using, and methods of preparing piezoelectric ceramics. For example, inventive products included within the scope of the invention include products identified previously if capable of being prepared according to a method disclosed herein. If there is any conflict in the usages of a word or term in this specification and one or more patent or other documents that may be incorporated herein by reference, definitions consistent with this specification should be adopted.

The invention claimed is:

1. A composition comprising a co-fired multilayer textured PMN-PZT or a co-fired multilayer textured PMN-PT ceramic with BaTiO$_3$ platelets oriented within the ceramic to a desired degree, wherein the ceramic has a piezoelectric coefficient d$_{33}$ ranging from 1000-3000 pC/N and a degree of orientation of 90% or more;

wherein the PMN-PZT ceramic comprises the formula 0.4Pb(Mg$_{1/3}$Nb$_{2/3}$)O$_3$-0.25PbZrO$_3$-0.35PbTiO$_3$ (40PMN-25PZ-35PT).

2. A composition comprising a co-fired multilayer textured PMN-PZT or a co-fired multilayer textured PMN-PT ceramic with BaTiO$_3$ platelets oriented within the ceramic to a desired degree, wherein the ceramic has a piezoelectric coefficient d$_{33}$ ranging from 1000-3000 pC/N and a degree of orientation of 90% or more;

wherein the BaTiO$_3$ platelets have an aspect ratio of from 5-20.

3. A composition comprising a co-fired multilayer textured PMN-PZT or a co-fired multilayer textured PMN-PT ceramic with BaTiO$_3$ platelets oriented within the ceramic to a desired degree, wherein the ceramic has a piezoelectric coefficient d$_{33}$ ranging from 1000-3000 pC/N and a degree of orientation of 90% or more;

wherein the composition comprises multiple layers and has a strain increase of greater than 2 times that of a random oriented PMN-PZT of the same empirical formula.

4. A composition comprising a co-fired multilayer textured PMN-PZT or a co-fired multilayer textured PMN-PT ceramic with $BaTiO_3$ platelets oriented within the ceramic to a desired degree, wherein the ceramic has a piezoelectric coefficient $d_{33}$ ranging from 1000-3000 pC/N and a degree of orientation of 90% or more;

wherein the composition comprises multiple layers and has a decrease in driving voltage of greater than 2 times that of a random oriented PMN-PZT with the same empirical formula.

5. A composition comprising a co-fired multilayer textured PMN-PZT or a co-fired multilayer textured PMN-PT ceramic with BaTiO3 platelets oriented within the ceramic to a desired degree, wherein the ceramic has a piezoelectric coefficient d33 ranging from 1000-3000 pC/N and a degree of orientation of 90% or more;

wherein the composition further comprises at least one internal electrode.

6. The composition of claim 5, wherein at least one of the internal electrodes is silver.

7. The composition of claim 5, wherein preparation of the composition involves co-firing of the piezoelectric and at least one of the internal electrodes to no more than 450° C. for about 2 hours and sintering at up to 930° C.

8. A composition comprising a co-fired multilayer textured PMN-PZT or a co-fired multilayer textured PMN-PT ceramic with BaTiO3 platelets oriented within the ceramic to a desired degree, wherein the ceramic has a piezoelectric coefficient d33 ranging from 1000-3000 pC/N and a degree of orientation of 90% or more;

wherein the composition comprises more than one layer, one of which is a magnetostrictive layer.

9. A composition comprising a co-fired multilayer textured PMN-PZT or a co-fired multilayer textured PMN-PT ceramic with $BaTiO_3$ platelets oriented within the ceramic to a desired degree, said composition characterized by having giant self-biased magnetoelectric coupling, wherein the ceramic has a piezoelectric coefficient $d_{33}$ ranging from 1000-3000 pC/N and a degree of orientation of 90% or more.

\* \* \* \* \*